United States Patent
Seko et al.

(10) Patent No.: US 6,597,017 B1
(45) Date of Patent: *Jul. 22, 2003

(54) SEMICONDUCTOR DEVICE, SURFACE EMITTING SEMICONDUCTOR LASER AND EDGE EMITTING SEMICONDUCTOR LASER

(75) Inventors: Yasuji Seko, Nakai-machi (JP); Akira Sakamoto, Nakai-machi (JP)

(73) Assignee: Fuji Xerox Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/520,188

(22) Filed: Mar. 7, 2000

(30) Foreign Application Priority Data

Mar. 26, 1999 (JP) ............................................ 11-084977
Jan. 26, 2000 (JP) ....................................... 2000-017582

(51) Int. Cl.$^7$ .............................................. H01L 27/15
(52) U.S. Cl. .................... 257/79; 257/80; 257/93; 257/98; 257/99; 257/103; 438/22; 438/24; 438/36; 438/37; 438/46; 438/47
(58) Field of Search ............................ 438/30, 36, 37, 438/46, 47, 438

(56) References Cited

U.S. PATENT DOCUMENTS 5,253,264 A * 10/1993 Suzuki et al. ................. 372/46
5,719,894 A * 2/1998 Jewell et al. .................. 372/45
6,072,189 A * 6/2000 Duggan ......................... 257/14

FOREIGN PATENT DOCUMENTS

| JP | A-8-307008 | 11/1996 |
|---|---|---|
| JP | A-9-45987 | 2/1997 |
| JP | A-10-84134 | 3/1998 |
| JP | A-10-308558 | 11/1998 |

OTHER PUBLICATIONS

*Lasing Emission from an $In_{o.1}Ga_{0.9}N$ Vertical Cavity Surface Emitting Laser*, Japanese Journal of Applied Physics, Part 2, vol. 37, No. 12A, pp. L1424–1426, 1998.

* cited by examiner

Primary Examiner—Long Pham
Assistant Examiner—Wai-Sing Louie
(74) Attorney, Agent, or Firm—Oliff & Berridge, PLC

(57) ABSTRACT

Provided is a semiconductor device that has pseudo lattice matched layers with good crystallinity, formed with lattice mismatched materials. Tensile-strained n-type $Al_{0.5}Ga_{0.5}N$ layers (lower side) and compressive-strained n-type $Ga_{0.9}In_{0.1}N$ layers (upper side) are grown on a GaN crystal layer substrate in 16.5 periods to form an n-type DBR mirror; an undoped GaN spacer layer and an active region are grown on the n-type DBR mirror; and an undoped a GaN spacer layer is grown on the active region. Further, tensile-strained p-type $Al_{0.5}Ga_{0.5}N$ layers (lower side) and compressive-strained p-type $Ga_{0.9}In_{0.1}N$ layers (upper side) are grown on the spacer layer in 12 periods to form a p-type DBR mirror and eventually complete a surface emitting semiconductor laser.

15 Claims, 10 Drawing Sheets

RELATION OF CLOSEST INTRA-ATOMIC DISTANCE VS. BANDGAP

SEMICONDUCTOR DEVICE, SURFACE EMITTING SEMICONDUCTOR LASER AND EDGE EMITTING SEMICONDUCTOR LASER

BACKGROUND OF THE INVENTION

1. Field of the Invention

The present invention generally relates to a semiconductor device including a pseudo lattice matched layer formed with a lattice mismatched semiconductor crystal. More particularly, the present invention relates to electronic devices such as: a light emitting devices, for example a surface emitting semiconductor laser and an edge emitting semiconductor laser used as a light source of a laser printer, a DVD device or a display; light receiving devices, for example a solar cell and a light quantity measuring sensor; and a transistor and so on.

2. Description of the Prior Art

Conventionally, layers constituting a semiconductor laser have basically been formed by stacking lattice matched materials except for a thin quantum well layer, a thin barrier layer and so on. For example, in a case of an AlGaAs based laser, AlAs (AlGaAs) lattice matched to and having a bandgap larger than GaAs and GaAs are employed to form heterojunctions and produce a band structure including a valence band and a conduction band of a laser. Further, in a case of GaInP based laser, crystals of $Ga_{0.51}In_{0.49}P$ and $(AlGa)_{0.51}In_{0.49}P$ whose bandgap is larger than that of $Ga_{0.51}In_{0.49}P$ are employed to form heterojunctions and produce a band structure of a laser, wherein the crystals are both lattice matched to GaAs.

In a case of a nitride semiconductor that has recently drawn attention as a material for a blue semiconductor laser, there is almost no material lattice matched to GaN that is used as a substrate. Further, a mixed crystal of $Al_{0.18}In_{0.82}N$, which is one of a few lattice matched materials, has a problem because of a bandgap smaller than GaN and poor crystallinity, whereby there has been found almost no way for the mixed crystal to be used as a device constituent layer. That is, in the case of a nitride semiconductor material, neither an edge emitting laser nor a surface emitting laser has been able to be produced from a lattice matched material Hence, lattice mismatched materials have been used for the purpose despite easy occurrence of crystal defects or the like.

For example, a DBR mirror of a surface emitting semiconductor laser has been formed with a multilayer having lattice mismatched materials ($Al_xGa_{1-x}N/GaN$) (see Japanese Journal of Applied Physics Vol. 37 (1998), pp. L1412 to L1426). However, in the multilayer, if a composition x of $Al_xGa_{1-x}N$ is set as high as $Al_{0.34}Ga_{0.66}N$, crystal defects such as cracks and misfit dislocations are produced because of a large difference in in-plane lattice constant between $Al_xGa_{1-x}N$ and GaN, leading to poor crystallinity. Further, if a composition x of $Al_xGa_{1-x}N$ is set low, though the lattice constants are closer to each other, a difference in refractive index between AlGaN and GaN is small, thereby reducing a reflectance of light and narrowing a wavelength range of reflection, which are both problematic.

There has also been proposed a nitride semiconductor laser in which a DBR mirror of a surface emitting semiconductor laser is constituted of a multilayer having dielectric different from the nitride semiconductor (see JP 98-308558 A). In this case, since a nitride semiconductor cannot directly be grown on a dielectric DBR mirror, the dielectric DBR is patterned by etching or the like such that part of a GaN crystal is exposed and a crystal of the nitride semiconductor is then laterally grown over the dielectric DBR starting from the exposed area of the GaN crystal, whereby a spacer layer, an active region and so on of the surface emitting semiconductor laser are formed. However, in this method, a cavity (resonator) including a spacer layer, active layer and so on formed on a dielectric DBR mirror has to be grown in a lateral direction over a length equal or more than 10 to 20 µm while restricting a thickness of the cavity within 3 to 4λ (equal to or less than about 600 nm, wherein λ is a wavelength). That is, as a result, a very thin flat crystal having opposite major surfaces parallel to each other is to be formed, thereby making fabrication of the laser difficult. Further, since this lateral growth is generally a case of a facet growth in which a crystallographic plane is preferentially grown, there is a fault that the growth speed is slow: the lateral growth over 10 µm or more requires a long time, which makes the method not suitable for mass fabrication.

Also in a case of a surface emitting semiconductor laser of a long wavelength range such as for use in communications, a problem exists since there are few kinds of material lattice matched InP and a DBR mirror formed with an AlGaInAsP based material lattice matched to InP cannot have a high refractive index, thereby making it impossible to fabricate a practical surface emitting semiconductor laser. Hence, conventionally, a surface emitting semiconductor laser has been fabricated, for example, in such a way that a multilayer DBR mirror of AlAs/GaAs, which is a GaAs based material, having a good reflection characteristic is separately prepared and an active region layer of a long wavelength AlGaInAsP based laser is stuck on the mirror; since in-plane lattice constants are largely different from each other, direct growth cannot be performed. The fabrication process, though possible, is problematically cumbersome, making it impractical.

Further, while there can be exemplified a nitride semiconductor laser in which the cladding layers of an edge emitting semiconductor laser are fabricated with a lattice mismatched materials ($Al_xGa_{1-x}N/GaN$), in this case, if a composition x of $Al_xGa_{1-x}N$ is set high, crystal defects such as cracks and misfit dislocations are produced and contrary to this, if a composition x of $Al_xGa_{1-x}N$ is set low, there also arises a problem since optical confinement is insufficient and in turn laser beam is leaked to the substrate side, followed by other inconveniences.

While as described above, in a case of the nitride semiconductor, a semiconductor multilayer has been formed using a lattice mismatched material with GaN, there has been arisen a problem, since crystal defects such as cracks and misfit dislocations are produced due to a difference in lattice constant, thereby making it difficult to fabricate a semiconductor multilayer of good crystallinity. Further, there has arisen a problem since if a material of a lattice constant closer to that of GaN is used for forming a semiconductor multilayer on GaN, a reflection characteristic of the semiconductor multilayer is degraded, which in turn makes it impossible to use the semiconductor multilayer as a DBR mirror of a surface emitting semiconductor laser or a cladding layer of an edge emitting semiconductor laser. Still further, there has arisen a problem in a case of InP that is used in a long wavelength range laser such as for use in communications as well, since a semiconductor multilayer formed using an AlGaInAsP based material having a lattice matching performance has a poor reflection characteristic and thereby, when the semiconductor multilayer is employed as a DBR mirror of a surface emitting semiconductor laser or a cladding layer of an edge emitting semiconductor laser, no sufficient light emission characteristic is achieved.

SUMMARY OF THE INVENTION

The present invention has been made in view of the above circumstances and accordingly provides a semiconductor device having a pseudo lattice matched layer of good crystallinity, formed with lattice mismatched materials. The present invention further provides a semiconductor device having a pseudo lattice matched layer of a good reflection characteristic, formed with lattice mismatched materials. The present invention still further provides a good surface emitting semiconductor laser and a good edge emitting semiconductor laser.

According to one aspect of the present invention, a semiconductor device includes: a semiconductor base layer made of a semiconductor crystal whose in-plane lattice constant is $a_0$; a pseudo lattice matched layer including a first layer made of a semiconductor crystal whose in-plane lattice constant is larger than $a_0$ and a second layer made of a semiconductor crystal whose in-plane lattice constant is smaller than $a_0$, the pseudo lattice matched layer being formed while being subjected to pseudo lattice matching by epitaxially growing the first and second layers on the semiconductor base layer such that lattice strains produced in the first and second layers assume opposite directions; and a functioning layer having at least one function of recombination, generation and migration of carriers.

In the present invention, a pseudo lattice matched layer including a first layer made of a semiconductor crystal whose in-plane lattice constant is larger than $a_0$ and a second layer made of a semiconductor crystal whose in-plane lattice constant is smaller than $a_0$ is epitaxially grown on the semiconductor base layer made of a semiconductor crystal whose in-plane lattice constant $a_0$. That is, the pseudo lattice matched layer is epitaxially grown on the semiconductor base layer using lattice mismatched materials.

In a case where the first layer is comparatively thin (equal to or less than a critical thickness), the first layer is within the range of elastic deformation and there is no generation of misfit dislocations therein, but since a semiconductor crystal whose in-plane lattice constant is larger than $a_0$ is epitaxially grown on the semiconductor base layer, a compressive stress remains in the grown semiconductor crystal. On the other hand, in a case where the second layer is comparatively thin (equal to or less than a critical thickness), the second layer is within the range of elastic deformation and there is no generation of misfit dislocations therein, but since a semiconductor crystal whose in-plane lattice constant is smaller than $a_0$ is epitaxially grown on the semiconductor base layer, a tensile stress remains in the grown semiconductor crystal. Since the compressive and tensile stresses act in opposite directions, the stresses are canceled as a whole and therefore, no increase in residual stress occurs even when layer stacking is repeated many times, thereby enabling a pseudo lattice matched semiconductor layer to be formed.

That is, since semiconductor crystals respectively constituting the first and second layers, which are pseudo lattice matched layers, mutually relax stresses therein, the semiconductor crystals whose lattice constants are largely different from that of a semiconductor base layer can be epitaxially grown on the semiconductor base layer while effecting pseudo lattice matching. As a result, no crystal defects such as cracks and misfit dislocations are generated, thereby entailing achievement of the pseudo lattice matched semiconductor layer with good crystallinity.

A functioning layer provided in addition to the semiconductor base layer and the pseudo lattice matched layer acts one function of recombination, generation and migration of carriers. That is, a semiconductor device of the present invention works as a light emitting device when the semiconductor device is imparted with a carrier recombination function, a light receiving device when the semiconductor device is imparted with a carrier generation function and an electronic device when the semiconductor device is imparted with a carrier migration function.

According to another aspect of the present invention, an in-plane lattice constant $a_x$ of the pseudo lattice matched layer satisfies the relation described below in connection with the in-plane lattice constant $a_0$ of the semiconductor crystal of the semiconductor base layer:

$$a_0 \times 0.997 \leq a_x \leq a_0 \times 1.003$$

Since the pseudo lattice matched layer is a mixed crystal having plural semiconductor crystals with different lattice constants, a lattice constant $x_0$ of the multilayer is given by the following formula, given that the number of layers respectively corresponding to the plural semiconductor crystals of the pseudo lattice matched layer is n:

$$a_x = \frac{\sum_{i=1}^{n} a_i d_i}{\sum_{i=1}^{n} d_i}$$

where $a_i$ and $d_i$ are a lattice constant and a thickness of a semiconductor crystal in the i-th layer respectively.

All that is needed is to adjust compositions and thicknesses of semiconductor crystals constituting the first and second layers such that the lattice constant $a_x$ of the pseudo lattice matched layer almost coincides with the in-plane lattice constant $a_0$ of semiconductor crystals of the semiconductor base layer. To be concrete, as shown in the relation, the lattice constant $a_x$ of the pseudo lattice matched layer is preferably within a fluctuation width ±0.3% of the lattice constant $a_0$. When the lattice constant $a_x$ of the pseudo lattice layer is in this range, a multilayer crystal of high quality by no means inferior to a lattice matched crystal can be fabricated. On the other hand, if the lattice constant $a_x$ fluctuates outside the fluctuation width ±0.3% of the lattice constant $a_0$, generation of crystal defects such as dislocations becomes conspicuous and there arise a possibility of generating cracks. Further, since irregularities, concave and convex, of a crystal surface are great and crystallinity is deteriorated, a DBR mirror, which is fabricated with such a multilayer crystal, problematically comes to have a poor reflectance and a narrowed reflection range.

According to another aspect of the present invention, an in-plane lattice constant $a_1$ of the semiconductor crystal of the first layer and an in-plane lattice constant $a_2$ of the semiconductor crystal of the second layer satisfy the relation described below:

$$a_0 \geq a_0 \times 1.003$$

$$a_2 \leq a_0 \times 0.997$$

According to another aspect of the present invention, an in-plane lattice constant $a_1$ of the semiconductor crystal of the first layer and an in-plane lattice constant $a_2$ of the semiconductor crystal of the second layer satisfy the relation described below:

$$a_1 \geq a_0 \times 1.006$$

$$a_2 \leq a_0 \times 0.994$$

As shown in the third and fourth aspects, when semiconductor crystals with in-plane lattice constants largely different from each other are stacked in combination, there can be fabricated a semiconductor crystal layer with a large or small bandgap, or with a high or low refractive index, which cannot be achieved from lattice matched crystals. That is, since a band structure including a conduction band and a valence band can be altered with comparative freedom, a degree of device design freedom is also raised.

According to another aspect of the present invention, the pseudo lattice matched layer is formed by alternately stacking the first and second layers.

According to another aspect of the present invention, the pseudo lattice matched layer includes a third layer made of a semiconductor crystal whose in-plane lattice constant is $a_0$ in addition to the first and second layers.

According to another aspect of the present invention, at least one of the first and second layers is formed by stacking plural semiconductor crystals with different in-plane lattice constants.

According to another aspect of the present invention, each layer of the pseudo lattice matched layer has a thickness equal to or less than 10 nm.

The first and second layers included in the pseudo lattice matched layer are only required to be epitaxially grown on a semiconductor base layer such that stresses respectively generated in the first and second layers are relaxed and there can be various ways of stacking the layers, which are shown as typical examples shown in the fifth to eighth aspects of the present invention as representatives.

Especially, when each layer included in the pseudo lattice matched layer is thinned (preferably to a value equal to or less than 10 nm), that is, formed as a short period superlattice layer, then mini bands are formed within the pseudo lattice matched layer and a bandgap of the pseudo lattice matched layer becomes larger than that of a semiconductor crystal of the semiconductor base layer. The bandgap is derived from Kronig-Penny theoretical equation on mini band formation in a short period superlattice. The pseudo lattice matched layer of a large bandgap can be applied to cladding layers disposed on both sides of the active layer of an edge emitting semiconductor laser.

There is a problem, for example, in the case of GaN based materials that $Al_{0.18}In_{0.82}N$ lattice matched to a GaN crystal has a bandgap smaller than GaN. When $Al_{0.18}In_{0.82}N$ is replaced by a pseudo lattice matched crystal having a short-period supper lattice structure including AlGaN and GaInN, a bandgap of the pseudo lattice matched crystal can be made larger than that of GaN. As shown in FIG. 7, an AlInN mixed crystal has an extremely large bandgap bowing. However, a pseudo latticed matched crystal alternately stacked with $Al_xGa_{1-x}N$ (x>0) and $Ga_{1-y}In_yN$ (y>0) has a bandgap larger than $Al_{0.18}In_{0.82}N$.

According to another aspect of the present invention, a bandgap of the pseudo lattice matched layer is larger than a bandgap of the semiconductor crystal of the semiconductor base layer.

While semiconductor crystals having a strain of 0.3% relative to GaN, which is a semiconductor crystal of a semiconductor base layer, in GaN based materials include $Al_{0.12}Ga_{0.88}N$ and $Ga_{0.97}In_{0.03}N$, the bandgap of $Al_{0.12}Ga_{0.88}N$ is larger than that of GaN by about 250 meV and the bandgap of $Ga_{0.97}In_{0.03}N$ is smaller than that of GaN by about 70 meV. When the semiconductor crystals are formed in a very short period superlattice structure, a bandgap of the short period superlattice is larger than GaN by about 90 meV. While semiconductor crystals each having an increased strain of 0.6% relative to GaN are $Al_{0.24}In_{0.76}N$ and $Ga_{0.94}In_{0.06}N$, if the semiconductor crystals are formed in a very short period superlattice structure, a bandgap of the short period superlattice is larger than that of GaN by about 180 meV.

The differences of the bandgaps between the short period superlattices and GaN are magnitudes that can each sufficiently confine electrons with a heterojunction interface of a band structure, and further can sufficiently be used in formation of a potential well in a laser active layer or as a potential difference between the emitter/base of a heterobipolar transistor as well. In the present invention, such a band structure constituted of bandgaps different in magnitudes can be formed by growing good crystals while being subjected to pseudo lattice matching.

According to another aspect of the present invention, the pseudo lattice matched layer is formed by alternately stacking high and low refractive index regions.

For example, while semiconductor crystals having a strain of 0.3% relative to GaN, which is a semiconductor crystal of a semiconductor base layer, in GaN based materials includes $Al_{0.12}Ga_{0.88}N$ and $Ga_{0.97}In_{0.03}N$, a refractive index of $Al_{0.12}Ga_{0.88}N$ is smaller than that of GaN by about 0.07 and a refractive index of $Ga_{0.97}In_{0.03}N$ is larger than that of GaN by about 0.1. Accordingly, when $Al_{0.12}Ga_{0.88}N$ and $Ga_{0.97}In_{0.03}N$ are alternately stacked, high refractive index layers and low refractive index layers are alternately formed in a pseudo lattice matched layer.

According to another aspect of the present invention, the high refractive index regions and the low refractive index regions are alternatively stacked with each region of $m\lambda/4$ in thickness, where $\lambda$ is an emission wavelength from an active region and m=1 or 3, to form a distributed-Bragg reflector mirror.

While high refractive index regions and low refractive index regions are alternatively stacked with each region in stacking of $m\lambda/4$ in thickness, where $\lambda$ is an emission wavelength from an active region and m=1 or 3, and thereby a distributed-Bragg reflecting mirror can be formed, since semiconductor crystals in a pseudo lattice matched layer are of high crystallinity, the semiconductor crystals can work as a distributed-Bragg reflecting mirror having a high reflection characteristic and a broad reflection range, which has not been achieved by a conventional lattice matched crystal. In order to improve a reflection characteristic, a refractive index difference $\Delta n$ is preferably set to 0.3 or larger.

While, in a case of GaN based materials, semiconductor crystals that are strained relative to GaN by 0.6%, which is a semiconductor crystal constituting a semiconductor base layer, include $Al_{0.24}Ga_{0.76}N$ and $Ga_{0.94}In_{0.06}N$, semiconductor crystals thus strained can exert a better reflection characteristic as a DBR mirror of a surface emitting semiconductor laser since a difference $\Delta n$ in refractive index between thus strained semiconductor crystals is 0.34.

It should be appreciated that calculation of refractive indices were performed based on famous Kramers-Kronig theoretical equation and results of actual measurements (reference document: Electronics Letters, 1996 Vol. 32, No. 24, 2285).

According to another aspect of the present invention, the semiconductor base layer is made of GaN or AlGaInN lattice matched to GaN, the first layer is made of $Ga_{1-x}In_xN$, wherein $0<x\leq 1$, and the second layer is made of $Al_yGa_{1-y}N$ wherein $0<y\leq 1$.

According to another aspect of the present invention, the semiconductor base layer is made of InP or AlGaInAsP lattice matched to InP, the first layer is made of $Al_xIn_{1-x}As_yP_{1-y}$, wherein $0<x\leq 1$ and $0\leq y<1$, and the second layer is made of $Ga_xIn_{1-x}As_yP_{1-y}$, wherein $0\leq x<1$ and $0<y\leq 1$.

Lattice matched materials from which a DBR mirror with a good reflection characteristic cannot be fabricated are, for example, GaN based semiconductor materials that emit short wavelength light such as blue and InP based semiconductor materials that emit light of a long wavelength ranging from 1.3 μm to 1.55 μm, which is used in communications or the like. The present invention is especially useful in use of these materials.

For example, in a case of InP based materials, an InP crystal is used as a semiconductor base layer, AlGaInAsP whose in-plane lattice constant is larger than that of InP is used as the first layer and GaInAsP whose in-plane lattice constant is smaller than that of InP is used as the second layer. Such a combination can realize a multilayer of a pseudo lattice matching type whose refractive index difference is larger than that not realized with any lattice matched materials that have conventionally been available. That is, since a DBR mirror with a good reflection characteristic can be fabricated, it is possible to grow a DBR mirror and an active region on a substrate at a time, resulting in an InP based surface emitting semiconductor laser with a good emission characteristic.

According to another aspect of the present invention, the semiconductor base layer is made of GaAs or AlGaInP lattice matched to GaAs, the first layer is made of $Ga_yIn_{1-y}P$, wherein $y<0.51$, and the second layer is made of $Al_zIn_{1-z}P$, wherein $z>0.51$.

Even in a case where a proper material that is lattice matched to a semiconductor crystal of a semiconductor base layer is available, use of a lattice mismatched material extends freedom of material selection, which in turn enables a pseudo lattice matching type multilayer having characteristics that have been impossible to achieve with conventional lattice matched materials, for example a high reflection characteristic.

According to another aspect of the present invention, a surface emitting semiconductor laser includes: a semiconductor base layer made of a semiconductor crystal whose in-plane intrinsic crystal lattice constant is $a_0$; a first distributed-Bragg reflector mirror of a pseudo lattice matching type including a first layer made of a semiconductor crystal whose in-plane lattice constant is larger than $a_0$ and a second layer made of a semiconductor crystal whose in-plane lattice constant is smaller than $a_0$, the first distributed-Bragg reflector mirror of a pseudo lattice matching type being formed while being subjected to pseudo lattice matching by epitaxially growing the first and second layers on the semiconductor base layer such that lattice strains produced in the first and second layers assume opposite directions; an active region formed on the first distributed-Bragg reflector mirror, which performs recombination of carriers; and a second distributed-Bragg reflector mirror that sandwiches the active region with the first distributed-Bragg reflector mirror, to form a resonator mirror structure with the first and second distributed-Bragg reflector mirrors.

According to another aspect of the present invention, the second distributed-Bragg reflector mirror is a distributed-Bragg reflector mirror of a pseudo lattice matching type including: a first layer made of a semiconductor crystal whose in-plane lattice constant is larger than $a_0$ and a second layer made of a semiconductor crystal whose in-plane lattice constant is smaller than $a_0$, the second distributed-Bragg reflector mirror of a pseudo lattice matching type being formed while being subjected to pseudo lattice matching by epitaxially growing the first and second layers on the semiconductor base layer such that lattice strains produced in the first and second layers assume opposite directions.

According to another aspect of the present invention, an edge emitting semiconductor laser includes: a semiconductor base layer made of a semiconductor crystal whose in-plane lattice constant is $a_0$; a first cladding layer of a pseudo lattice matching type including a first layer made of a semiconductor crystal whose in-plane lattice constant is larger than $a_0$ and a second layer made of a semiconductor crystal whose in-plane lattice constant is smaller than $a_0$, the first cladding layer of a pseudo lattice matching type being formed while being subjected to pseudo lattice matching by epitaxially growing of the first and second layers on the semiconductor base layer such that lattice strains produced in the first and second layers assume opposite directions; an active region formed on the first cladding layer, which performs recombination of carrier; a second cladding layer that sandwiches the active region with the first cladding layer, to achieve light confinement in the active region; and a pair of edge reflector mirrors disposed in an opposite manner to each other, which resonate light generated in the active region in a predetermined plane direction of the active region.

Since a DBR mirror of a surface emitting semiconductor laser or a cladding layer of an edge emitting semiconductor laser is constituted of a pseudo lattice matched layer that is formed with lattice mismatched materials, all of layers whose thickness are comparatively large except for an active region can be fabricated by means of crystal growth, which can realize a highly reliable, long life-time semiconductor laser having no crystal defects such as cracks and misfit dislocations.

It should be appreciated that the term "a semiconductor base layer" means a semiconductor substrate, or a semiconductor crystal layer formed on the substrate.

BRIEF DESCRIPTION OF THE DRAWINGS

Preferred embodiments of the present invention will be described in detail on the followings, wherein.

DESCRIPTION OF THE PREFERRED EMBODIMENTS

The following are detailed descriptions of embodiments of the present invention with reference to the accompanying drawings.

First Embodiment

Figure 1:
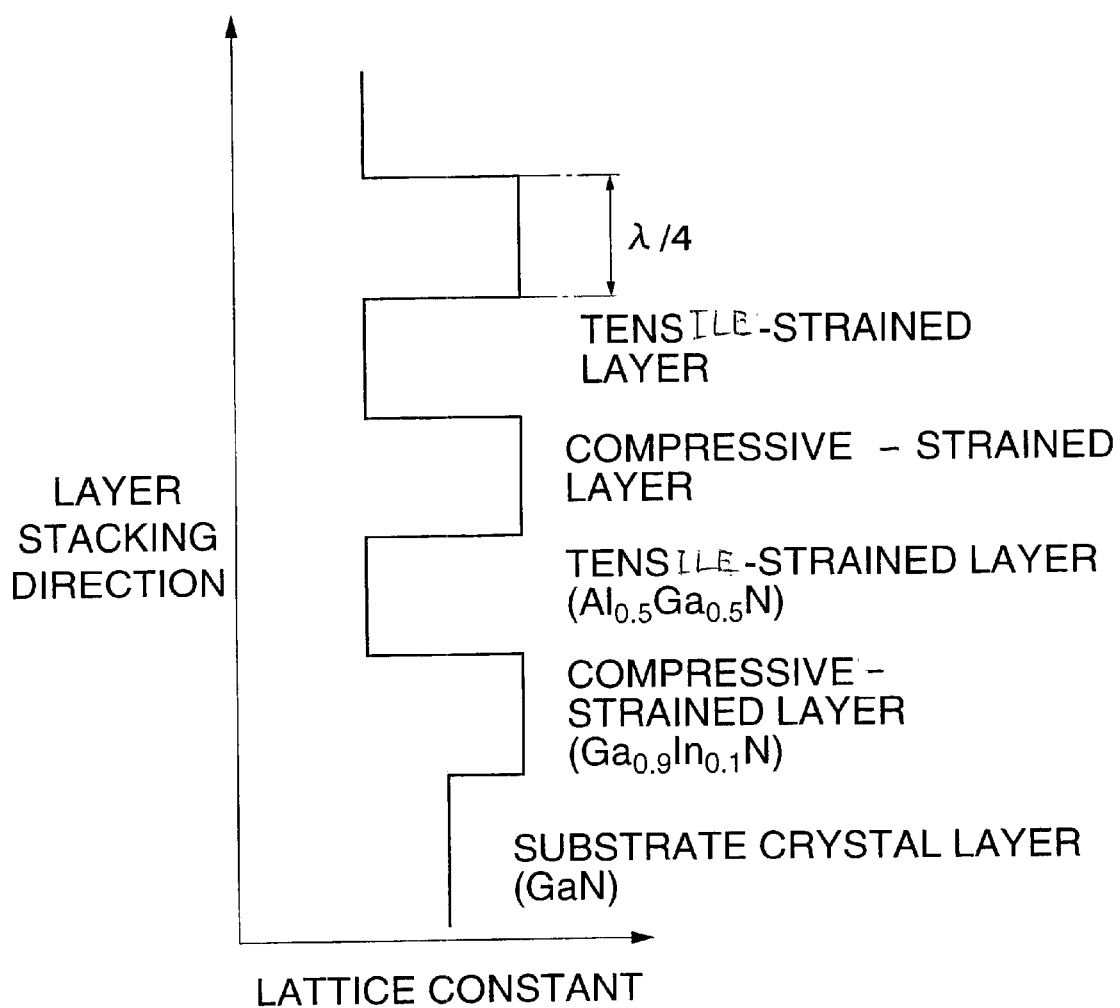
FIG. 1 is a schematic illustration for a structure of a semiconductor device of a first embodiment.

The first embodiment is an example in which the present invention was applied to a semiconductor device having a DBR mirror. In the embodiment, as schematically shown in FIG. 1, $Ga_{0.9}In_{0.1}N$ layers and $Al_{0.5}Ga_{0.5}N$ layers were alternately stacked on a GaN crystal substrate by a growth method MOCVD (metal organic chemical vapor deposition) method to form a DBR mirror. First of all, the GaN substrate was prepared such that a GaN layer was grown on a sapphire substrate at about 1000° C. to a thickness of about 100 μm, followed by polishing-off of the sapphire substrate. Further, $Ga_{0.9}In_{0.1}N$ layers and $Al_{0.5}Ga_{0.5}N$ layers were alternately grown at about 800° C. using trimethyl gallium (TMGa), trimethyl aluminum (TMAl) and trimethyl indium (TMIn) as raw materials and a mixed gas of $H_2$ and $N_2$ as a carrier gas. In Table 1, there are shown lattice constants, strains, refractive indices and thicknesses of semiconductor crystals constituting layers. In Table 1, there are additionally shown the lattice constants and strains of mixed crystals. The lattice constants are in-plane lattice constants of the semiconductor crystals constituting layers and the refractive indices are of light with a wavelength λ (430 nm) and a thickness of each layer corresponds to an optical path length of λ/4. Further, from lattice constants of semiconductor crystals constituting the layers, not only were strains of the layers (a ratio of a lattice constant of a semiconductor crystal constituting a layer to a lattice constant of a GaN crystal) respectively calculated, but also a lattice constant of a DBR mirror (a lattice constant of a mixed crystal of $Ga_{0.9}In_{0.1}N$ and $Al_{0.5}Ga_{0.5}N$) and a strain thereof (a ratio of a lattice constant of the mixed crystal to the lattice constant of the GaN crystal) were calculated. As shown in Table 1, a strain of a $Ga_{0.9}In_{0.1}N$ layer is 1.011 of a compressive-strained layer, while a strain of a $Al_{0.5}Ga_{0.5}N$ layer is 0.988 of a tensile-strained layer.

TABLE 1

|  | First embodiment | | Conventional example | |
| --- | --- | --- | --- | --- |
|  | $Ga_{0.9}In_{0.1}N$ | $Al_{0.5}Ga_{0.5}N$ | GaN | $Al_{0.34}Ga_{0.66}N$ |
| Lattice constants (Å) | 3.225 | 3.151 | 3.189 | 3.163 |
| Strains (strain ratios) | 1.011(1.1%) | 0.988(−1.2%) | 1.000 | 0.992(−0.8%) |
| Refractive indices | 2.85 | 2.23 | 2.52 | 2.43 |
| λ/4 thicknesses (nm) | 37.7 | 48.2 | 42.7 | 44.2 |
| Lattice constants of mixed crystals (Å) | 3.192 | | 3.169 | |
| Strains (strain ratios) of mixed crystals | 0.998(−0.2%) | | 0.996(−0.4%) | |

First of all, a crystal quality was investigated on thus obtained DBR mirror. Given that the lattice constant of a mixed crystal of $Ga_{0.9}In_{0.1}N$ and $Al_{0.5}Ga_{0.5}N$ is 3.192Å (wurtzite structure) and a lattice constant of GaN is 3.189Å, a strain of the DBR mirror is 0.998 and a strain ratio relative to the GaN crystal substrate is a scant −0.2%. From the results of calculation, it is understood that the stresses are canceled by each other as a whole by alternately stacking compressive-strained layers and tensile-strained layers. It was found that from observation under an optical microscope on the DBR mirror thus obtained, no cracks occur; and from investigation by X ray diffraction of the DBR mirror, no lattice relaxation occurred and a crystal quality thereof was as good as that of normal lattice matched crystal such as AlGaAs materials, which is supported by the above result of calculation. With higher crystallinity of the DBR mirror, crystallinities of a spacer layer and an active region are also higher, in turn enabling a surface emitting semiconductor laser of good emission characteristic to be fabricated.

On the other hand, as additionally shown in Table 1, in a case of a conventional lattice mismatching type DBR mirror that was alternately stacked with $Al_{0.34}Ga_{0.66}N$ layers and GaN layers, a strain of an $Al_{0.34}Ga_{0.66}N$ layer is 0.992 of a tensile-strained layer and a strain of an GaN layer is 1.000 of a non-strained layer. Since a lattice constant of a mixed crystal of $Al_{0.34}Ga_{0.66}N$ and GaN is 3.169Å and a lattice constant of GaN is 3.189Å, therefore a strain of the DBR mirror is 0.996 and a strain ratio relative to the GaN crystal substrate is −0.4%. From the result of calculation, it is understood that even if tensile-strained layers and non-strained layers are alternately stacked, strains are only dispersed throughout the entire bulk, but no decrease in the total strains occurs. Under observation with a optical microscope on the DBR mirror thus obtained, it was found that defects such as cracks occurred as layers were stacked.

Figure 2:
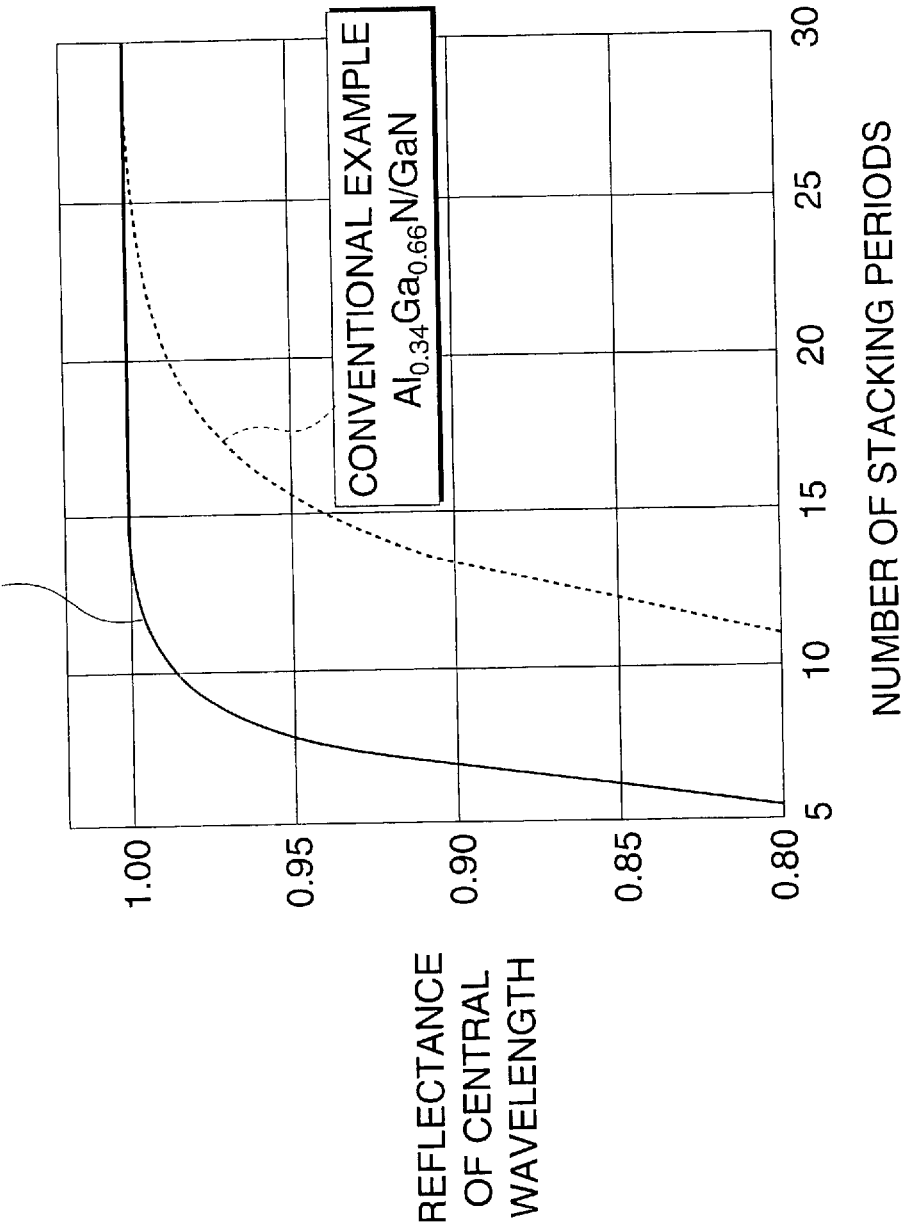
FIG. 2 is a graph showing a reflection characteristic (a relation of the number of stacking periods to a reflectance) of a DBR mirror of the semiconductor device of a first embodiment.

Then, refection characteristic of the DBR mirror thus obtained was investigated. As shown in Table 1, in the case of a DBR mirror where $Ga_{0.9}In_{0.1}N$ and $Al_{0.5}Ga_{0.5}N$ were alternately stacked, since $Ga_{0.9}In_{0.1}N$ has a refractive index higher than GaN and $Al_{0.5}Ga_{0.5}N$ has a refractive index lower than GaN, $Ga_{0.9}In_{0.1}N$ layers were high refractive index regions and $Al_{0.5}Ga_{0.5}N$ regions were low refractive index regions. In FIG. 2, there is shown a relation of the number of stacking periods to a reflection characteristic of the DBR mirror in which $Ga_{0.9}In_{0.1}N$ layers and $Al_{0.5}Ga_{0.5}N$ layers were alternately stacked to form the DBR mirror. For comparison, drawing will also be made of a relation of the number of stacking periods to a reflection characteristic of a conventional DBR mirror of a lattice mismatching type in which $Al_{0.34}Ga_{0.66}N$ layers and GaN layers were alternately stacked. As is apparent from FIG. 2, if a DBR mirror that is alternately stacked with $Ga_{0.9}In_{0.1}N$ layers and $Al_{0.5}Ga_{0.5}N$ layers is adopted, a high reflectance can be attained with the number of stacking periods less than in a case of the conventional DBR mirror of a lattice mismatching type. For example, in order to ensure a reflectance of 99.5% or higher, though the number of stacking periods is 12 in the DBR mirror that is obtained by alternately stacking with $Ga_{0.9}In_{0.1}N$ layers and $Al_{0.5}Ga_{0.5}N$ layers, the number of stacking periods in the conventional DBR mirror of a lattice mismatching type is 23 as the minimum requirement. In such a way, since a higher reflectance can be obtained with less in the number of stacking periods, an advantage of a shorter fabrication time (a crystal growth time) for a device can be enjoyed. Further, an electric resistance becomes low for a surface emitting semiconductor laser in which a current flows through the DBR mirror, thereby realizing an effect of improving a performance of the surface semiconductor laser.

Figure 3:
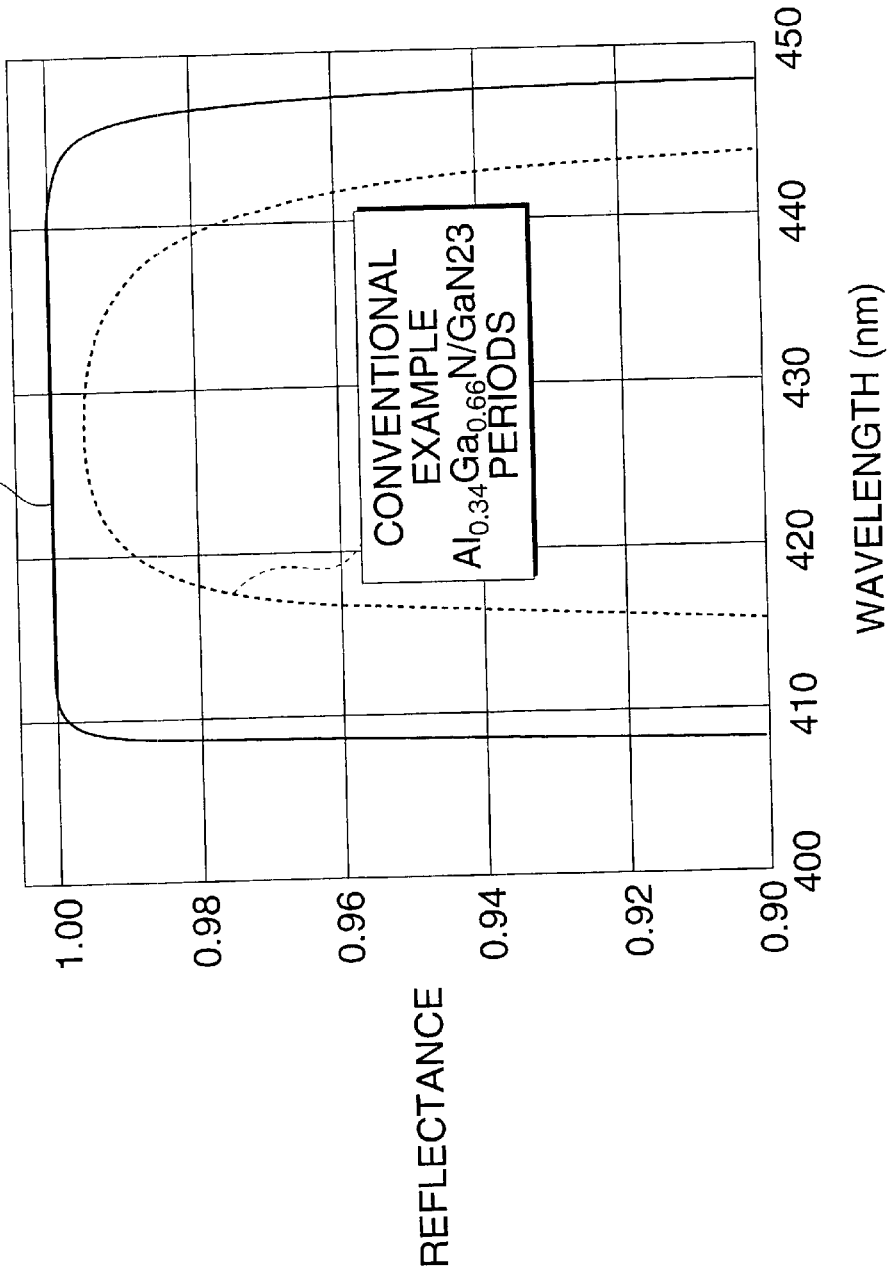
FIG. 3 is a graph showing a reflection wavelength range of a DBR mirror of the semiconductor device of a first embodiment.

Further, as shown in FIG. 3, in cases where the numbers of stacking periods of DBR mirrors are the same as each other, a DBR mirror that is alternately stacked with $Ga_{0.9}In_{0.1}N$ layers and $Al_{0.5}Ga_{0.5}N$ layers has a wavelength range of a reflecting light broader than that of a conventional DBR mirror of a lattice mismatching type. A wavelength range which shows a reflectance of 99% or higher is close to about 40 nm for the DBR mirror that was alternately stacked with $Ga_{0.9}In_{0.1}N$ layers and $Al_{0.5}Ga_{0.5}N$ layers, whereas the wavelength range is as narrow as about 16 nm for a conventional lattice mismatching type DBR mirror. A narrow wavelength range means that a reflectance of a DBR mirror is easily reduced according to a change in wavelength, leading to reduction in reliability of a device. For example, when a wavelength range of a reflecting light of a DBR mirror of a surface emitting semiconductor laser is narrow, there arise requirements for strict wavelength control for a light emitting layer and precise fabrication of structural layers constituting a DBR mirror and in addition to the requirements, there is imposed adverse influence that laser characteristic is greatly deteriorated according to a change in wavelength of reflecting light caused by a change in temperature. Since the DBR mirror that is alternately stacked with $Ga_{0.9}In_{0.1}N$ layers and $Al_{0.5}Ga_{0.5}N$ layers has a broad wavelength range, the DBR mirror can properly be adapted for a change in wavelength of reflecting light, leading to improvement on reliability of a device. Further, precision in fabrication of a surface emitting semiconductor laser is relaxed, which in turn, stabilizes the laser characteristics.

While, in the distributed-Bragg reflector mirror of the first embodiment, the mirror was fabricated by alternately stacking with high refractive regions and low refractive regions with each region of a constant $\lambda/4$ in thickness, the alternate stacking may be performed with each region of a constant $3\lambda/4$ in thickness.

Second Embodiment

Figure 5:
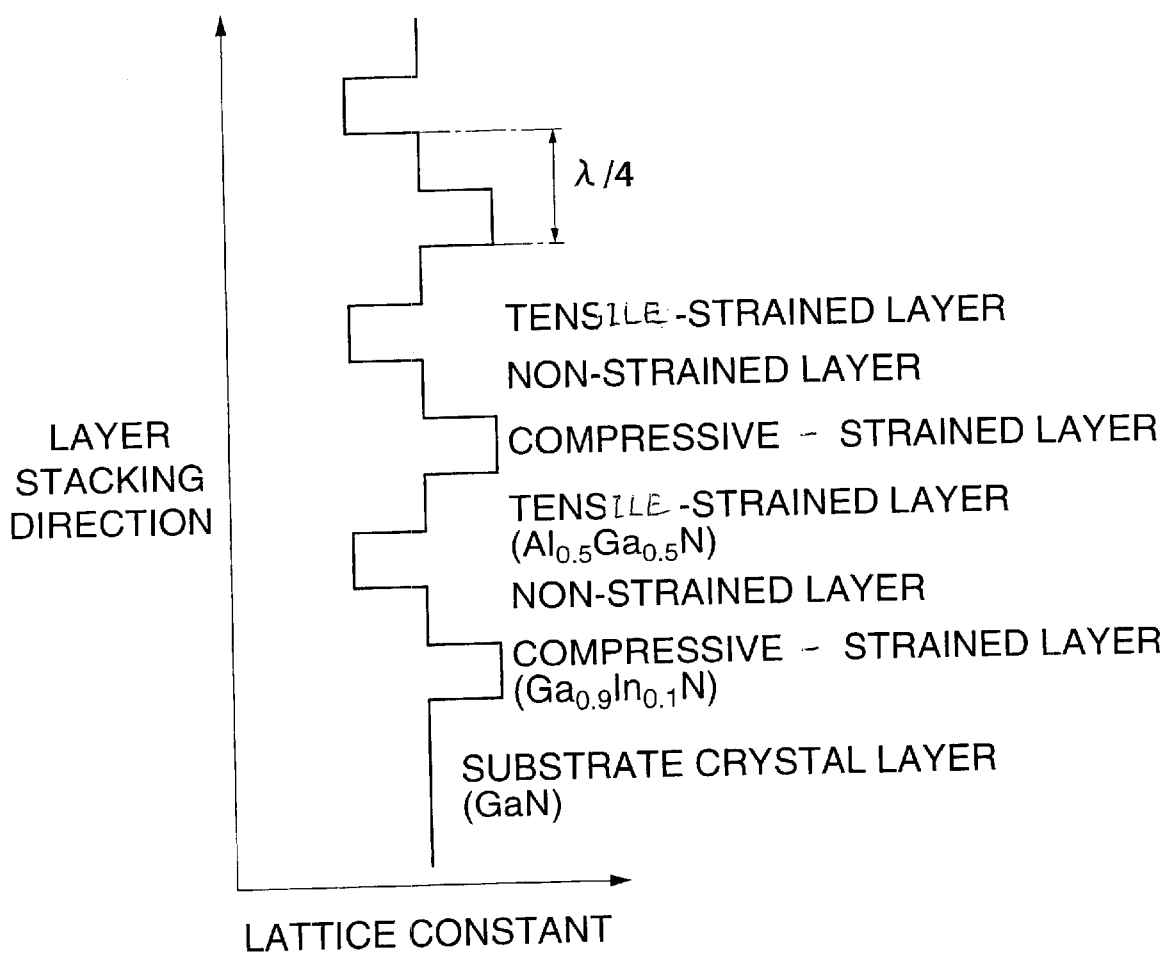
FIG. 5 is a schematic illustration for a structure of a semiconductor device of a second embodiment.

The second embodiment is a modification of the first embodiment in which a layered structure of the DBR mirror of a semiconductor device was modified. While in the first embodiment, the case where the DBR mirror was fabricated by alternately stacking the compressive-strained $Ga_{0.9}In_{0.1}N$ layers and the tensile-strained $Al_{0.5}Ga_{0.5}N$ layers with each layer of a constant $\lambda/4$ in thickness, in the second embodiment, as schematically shown in FIG. 5, non-strained layers made of the same semiconductor crystal (GaN) as a substrate were respectively inserted between adjacent sets of compressive-strained $Ga_{0.9}In_{0.1}N$ layers and tensile-strained $Al_{0.5}Ga_{0.5}N$ layers, thus fabricating a DBR mirror. To be concrete, the following layers are successively and repeatedly stacked on a GaN crystal substrate to respective thicknesses as shown in the order thereof: a $Ga_{0.9}In_{0.1}N$ layer of 19 nm; a GaN layer of 20 nm; an $Al_{0.5}Ga_{0.5}N$ layer of 24 nm; and a GaN layer of 20 nm. In the case of the DBR mirror, a high refractive index region is constructed of a compressive-strained $Ga_{0.9}In_{0.1}N$ layer and a non-strained GaN layer, and a low refractive index region is constructed of a tensile-strained $Al_{0.5}Ga_{0.5}N$ layer and a non-strained GaN layer. In Table 2, there are shown lattice constants, strains, refractive indices and thicknesses of semiconductor crystals constituting layers. In Table 2, there are additionally shown the lattice constants and strains of mixed crystals.

TABLE 2

| | Second embodiment | | | |
|---|---|---|---|---|
| | $Ga_{0.9}In_{0.1}N$/GaN compressive-strained layers | | $Al_{0.5}Ga_{0.5}N$/GaN tensile-strained layers | |
| | $Ga_{0.9}In_{0.1}N$ | GaN | $Al_{0.5}Ga_{0.5}N$ | GaN |
| Lattice constants (%) | 3.225 | 3.189 | 3.151 | 3.189 |
| Strains (strain ratios) | 1.011(1.1%) | 1.000 | 0.988(−1.2%) | 1.000 |
| Refractive indices | 2.85 | 2.52 | 2.23 | 2.52 |
| Thicknesses (nm) of single layers | 19 | 20 | 24 | 20 |
| $\lambda/4$ thicknesses (nm) of layers | 39 | | 44 | |
| Lattice constant of mixed crystal (%) | 3.186 | | | |
| Strains (strain ratios) of mixed crystals | 0.999(−0.1%) | | | |

In the second embodiment as well, similar to the first embodiment, a DBR mirror of good crystallinity could be obtained. Further, since in the second embodiment, a non-strained GaN layer was interposed at the interface between any pair of a compressive-strained $Ga_{0.9}In_{0.1}N$ layer and a tensile-strained $Al_{0.5}Ga_{0.5}N$ layer, thicknesses of strained layers could be thinned without much reduction in reflection characteristic of the DBR mirror. Since a compressive-strained $Ga_{0.9}In_{0.1}N$ layer and a tensile-strained $Al_{0.5}Ga_{0.5}N$ layer are respectively thinned, occurrence of misfit dislocations can be restricted, thereby enabling a crystal quality to be increased.

Third Embodiment

Figure 6A:
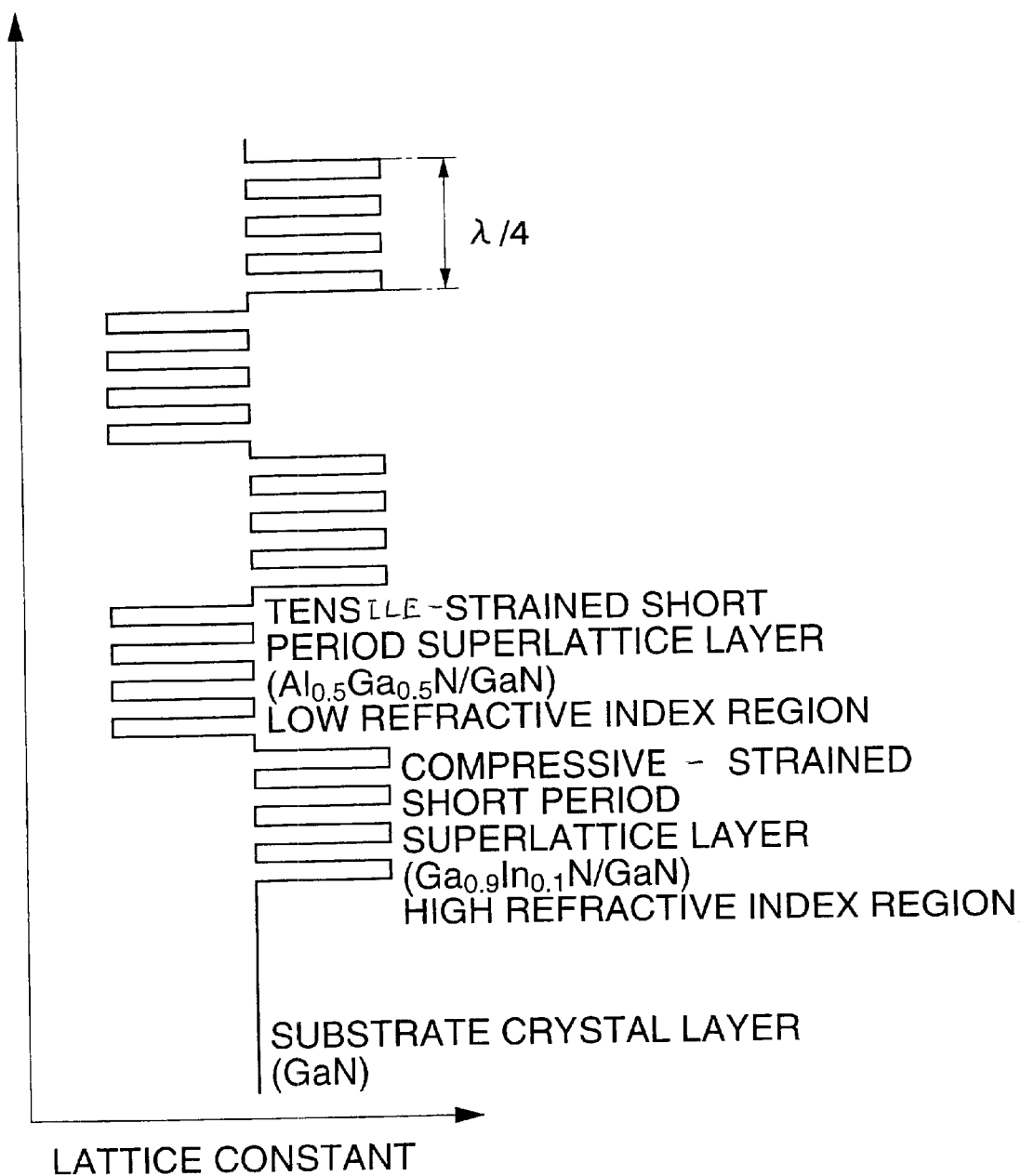
FIG. 6A is a schematic illustration for a structure of a semiconductor device of a third embodiment.

The third embodiment is a modification of the first embodiment in which a layered structure of the DBR mirror of a semiconductor device was modified. While in the first embodiment, the case where the DBR mirror was fabricated by alternately stacking the compressive-strained $Ga_{0.9}In_{0.1}N$ layers and the tensile-strained $Al_{0.5}Ga_{0.15}N$ layers with each layer of $\lambda/4$ in thickness, in the third embodiment, as schematically shown in FIG. 6A, compressive-strained short period superlattice layers each with 10 period stack of a compressive-strained $Ga_{0.9}In_{0.1}N$ layer and a non-strained GaN layer combined as one period and tensile-strained short period superlattice layers each with 10 period stacks of a tensile-strained $Al_{0.5}Ga_{0.5}N$ layer and a non-strained GaN layer combined as one period were alternately stacked with each superlattice layer of $\lambda/4$ in thickness, thus fabricating a DBR mirror. In a case of this DBR mirror, a compressive-strained short period superlattice layer constitutes a high refractive index region while a tensile-strained short period superlattice layer constitutes a low index region. In Table 3, there are shown lattice constants, strains, refractive indices and thicknesses of semiconductor crystals constituting layers. In Table 3, there are additionally shown the lattice constants and strains of mixed crystals.

TABLE 3

| | Third embodiment | | | |
|---|---|---|---|---|
| | $Ga_{0.9}In_{0.1}N/GaN$ compressive-strained superlattice | | $Al_{0.5}Ga_{0.5}N/GaN$ tensile-strained superlattice | |
| | $Ga_{0.9}In_{0.1}N$ | GaN | $Al_{0.5}Ga_{0.5}N$ | GaN |
| Lattice constants (Å) | 3.225 | 3.189 | 3.151 | 3.189 |
| Strains (strain ratios) | 1.011(1.1%) | 1.000 | 0.988(−1.2%) | 1.000 |
| Refractive indices | 2.85 | 2.52 | 2.23 | 2.52 |
| Thicknesses (nm) of single layers | 1.9 | 2.0 | 2.4 | 2.0 |
| $\lambda/4$ thicknesses (nm) of layers | 39 | | 44 | |
| Lattice constant of mixed crystal (Å) | 3.186 | | | |
| Strains (strain ratios) of mixed crystals | 0.999(−0.1%) | | | |

In the third embodiment as well, similarly to the first embodiment, the DBR mirror of good crystallinity could be obtained. Further, since in the third embodiment, a thickness of each layers included in a short period superlattice layer of $\lambda/4$ is 10 nm or less, for example in a case where a tensile-strained short period superlattice layer is constructed of pairs of a tensile-strained $Al_{0.5}Ga_{0.5}N$ layer and a non-strained GaN, an advantage can be enjoyed since doping with a high activation yield can be achieved by doping into the GaN layer only.

Figure 6B:
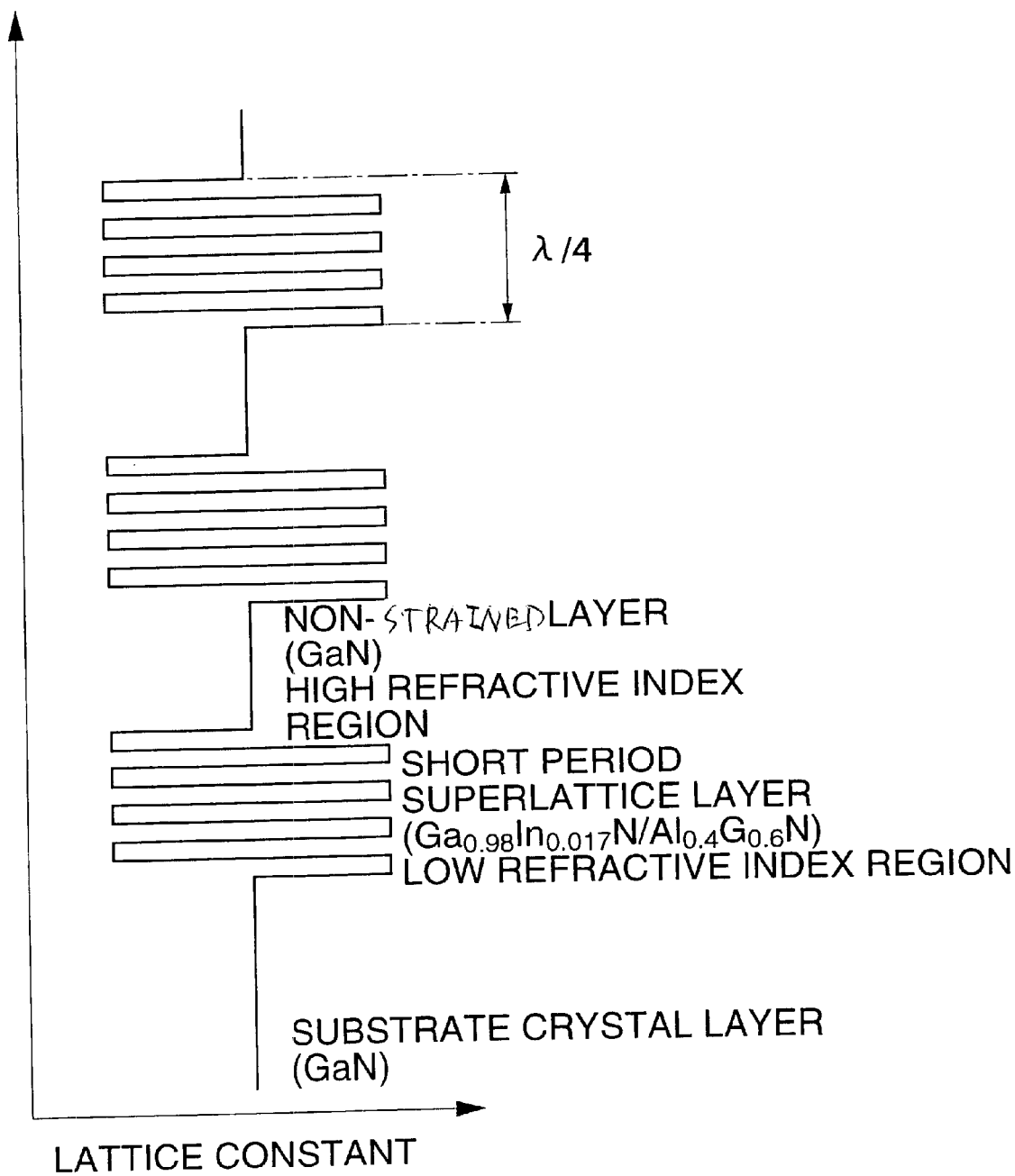
FIG. 6B is a schematic illustration for a structure of a semiconductor device of a fourth embodiment and FIG. 6C is a schematic illustration for a structure of a semiconductor device of a fifth embodiment.
Figure 6C:
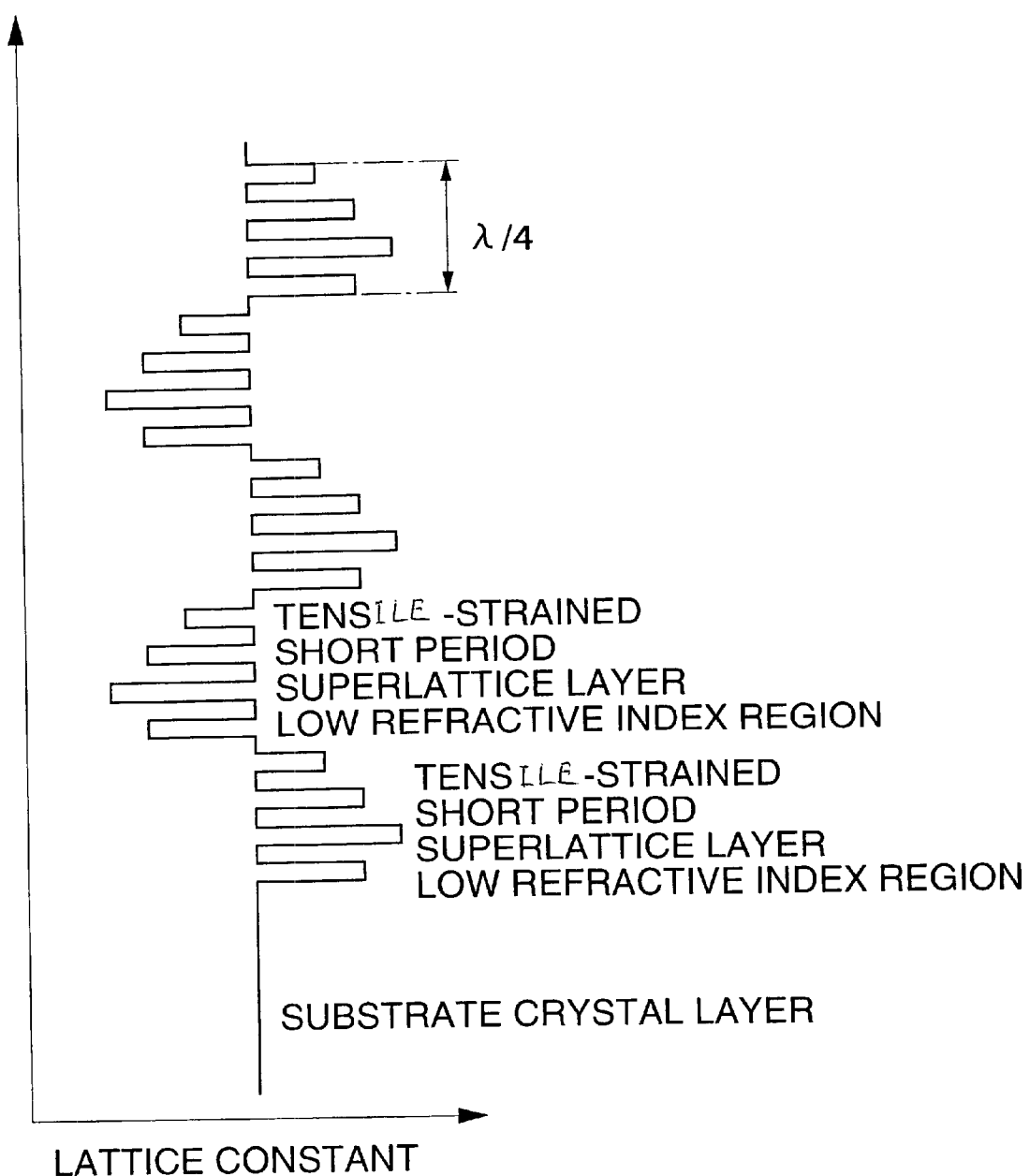
Figure 7:
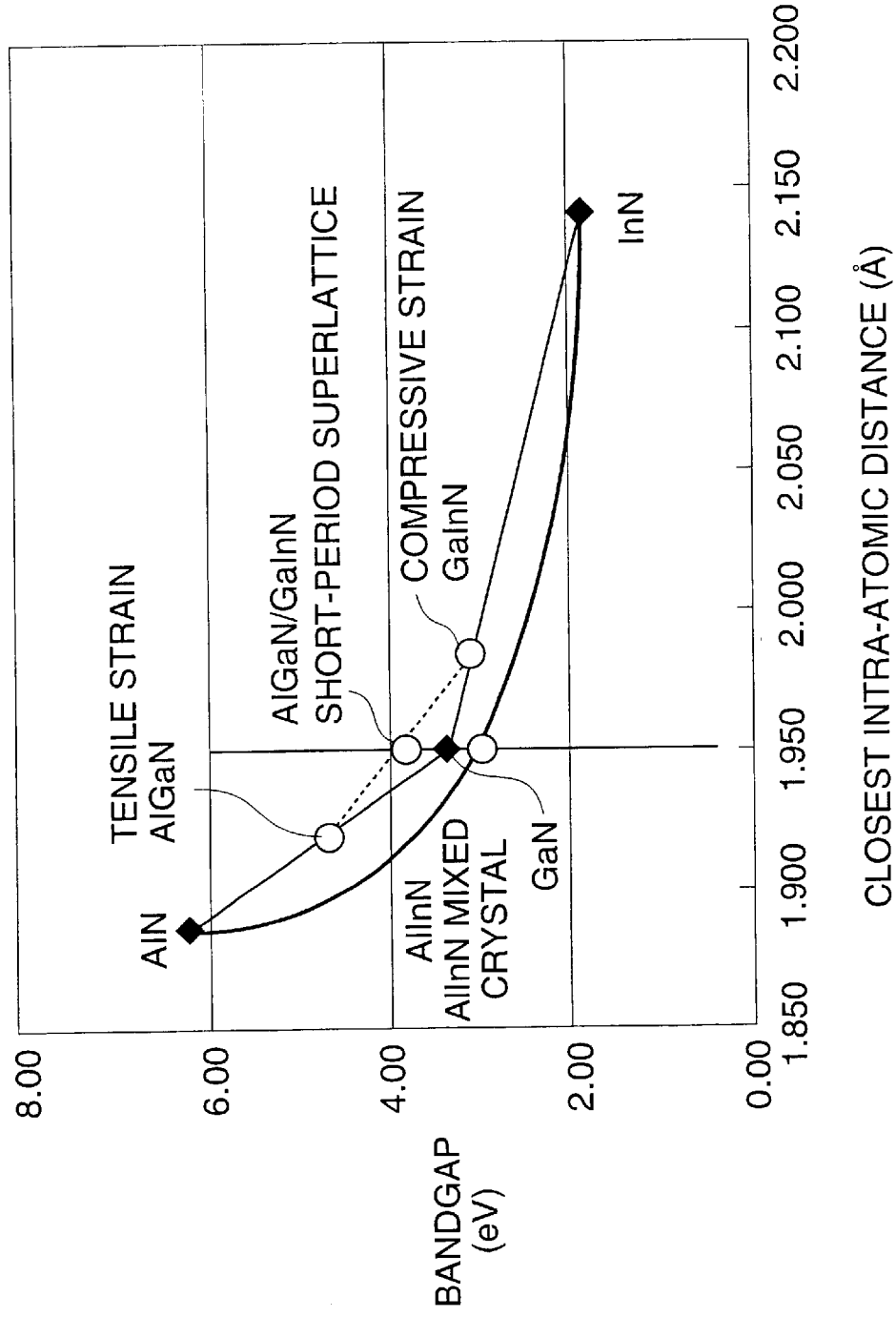
FIG. 7 is a graph showing a relation of a closest intra-atomic distance to a bandgap of GaN based semiconductor materials.

While in the third embodiment, a compressive-strained short period superlattice layer was constructed of two kinds of semiconductor crystals including $Ga_{0.9}In_{0.1}N$ layers and GaN layers and a tensile-strained short period superlattice layer was constructed of two kinds of semiconductor crystals including $Al_{0.5}Ga_{0.5}N$ layers and GaN layers, as schematically shown in FIG. 6C, short period superlattice layers may each be constructed of three or more kinds of semiconductor crystals whose lattice constants are different from one another. It should be appreciated that there is no need for incorporation of a non-strained layer made of the same semiconductor crystal as a substrate into a short period superlattice layer.

Fourth Embodiment

The fourth embodiment is a modification of the first embodiment in which a layered structure of the DBR mirror of a semiconductor device was modified. While in the first to third embodiments, there are shown the cases in each of which a DBR mirror was fabricated such that each of the layers (including a short period superlattice layer) each of $\lambda/4$ in thickness had a compressive strain or a tensile strain, and that a layer with a compressive strain constituted a high refractive index region and a layer with a tensile strain constituted a low refractive index layer, in the fourth embodiment, as schematically shown in FIG. 6B, short period superlattice layers each with a 10 period stack of a compressive-strained $Ga_{0.983}In_{0.017}N$ layer and a tensile-strained $Al_{0.4}Ga_{0.6}N$ layer combined as one period and non-strained GaN layers were alternately stacked with each superlattice layer of $\lambda/4$ in thickness and each GaN layer of $\lambda/4$ in thickness, thus fabricating a DBR mirror. Since a refractive index of a short period superlattice layer constructed with the 10 period stack of a compressive-strained $Ga_{0.983}In_{0.017}N$ layer and a tensile-strained $Al_{0.4}Ga_{0.6}N$ layer is smaller than that of GaN by about 0.12, a DBR mirror can be fabricated with the short period superlattice layers each as a low refractive index region and non-strained GaN layers each as a high refractive index region. In Table 4, there are shown lattice constants, strains, refractive indices and thicknesses of semiconductor crystals constituting layers. In Table 4, there are additionally shown the lattice constants and strains of mixed crystals.

TABLE 4

| | Fourth embodiment | | |
|---|---|---|---|
| | $Ga_{0.983}In_{0.017}N/Al_{0.4}Ga_{0.6}N$ superlattice | | Non-strained layer |
| | $Ga_{0.983}In_{0.017}N$ | $Al_{0.4}Ga_{0.6}N$ | GaN |
| Lattice constants (Å) | 3.195 | 3.158 | 3.189 |
| Strains (strain ratios) | 1.002(0.2%) | 0.990(−1.0%) | 1.000 |
| Refractive indices | 2.57 | 2.29 | 2.52 |
| Thicknesses (nm) of single layers | 2.0 | 2.45 | 42.7 |
| Lattice constants of layers (Å) | 3.179 | | 3.189 |
| Strains (strain ratios) of layers | 0.997(−0.3%) | | 1.000 |
| Refractive indices of layers | 2.42 | | 2.52 |
| $\lambda/4$ thicknesses (nm) of layers | 44.5 | | 42.7 |
| Lattice constant of mixed crystal (Å) | 3.184 | | |
| Strain (strain ratio) of mixed crystal | 0.998(−0.2%) | | |

In the fourth embodiment as well, similarly to the first embodiment, the DBR mirror with good crystallinity was able to be obtained. Further, since in the fourth embodiment, one of two kinds of the layers each of $\lambda/4$ in thickness was a non-strained GaN layer, a thickness of each strained layer can be very small and thereby, occurrence of misfit dislocations is sufficiently restricted, further leading to an advantage to make it possible to incorporate a layer with a large refractive index difference.

Further, while in the fourth embodiment, the DBR mirror was fabricated with short period superlattice layers obtained by stacking compressive-strained $Ga_{0.983}In_{0.017}N$ layers and tensile-strained $Al_{0.4}Ga_{0.6}N$ layers as low refractive index regions and non-stained GaN layers as high refractive index regions, all that is needed for functioning a layered structure as a DBR mirror to form the DBR mirror by alternately stacking high refractive regions each of a refractive index equal to or higher than a predetermined value and low refractive index regions with a thickness of each region of $m\lambda/4$, wherein $\lambda$ is a wavelength of emission from an active region and m=1 or 3. The high refractive index regions and low refractive index regions can be fabricated by adjusting refractive indices of short period superlattices through combinations of plural kinds of semiconductor crystals or by stacking semiconductor crystals of different refractive indices.

Fifth Embodiment

Figure 4:
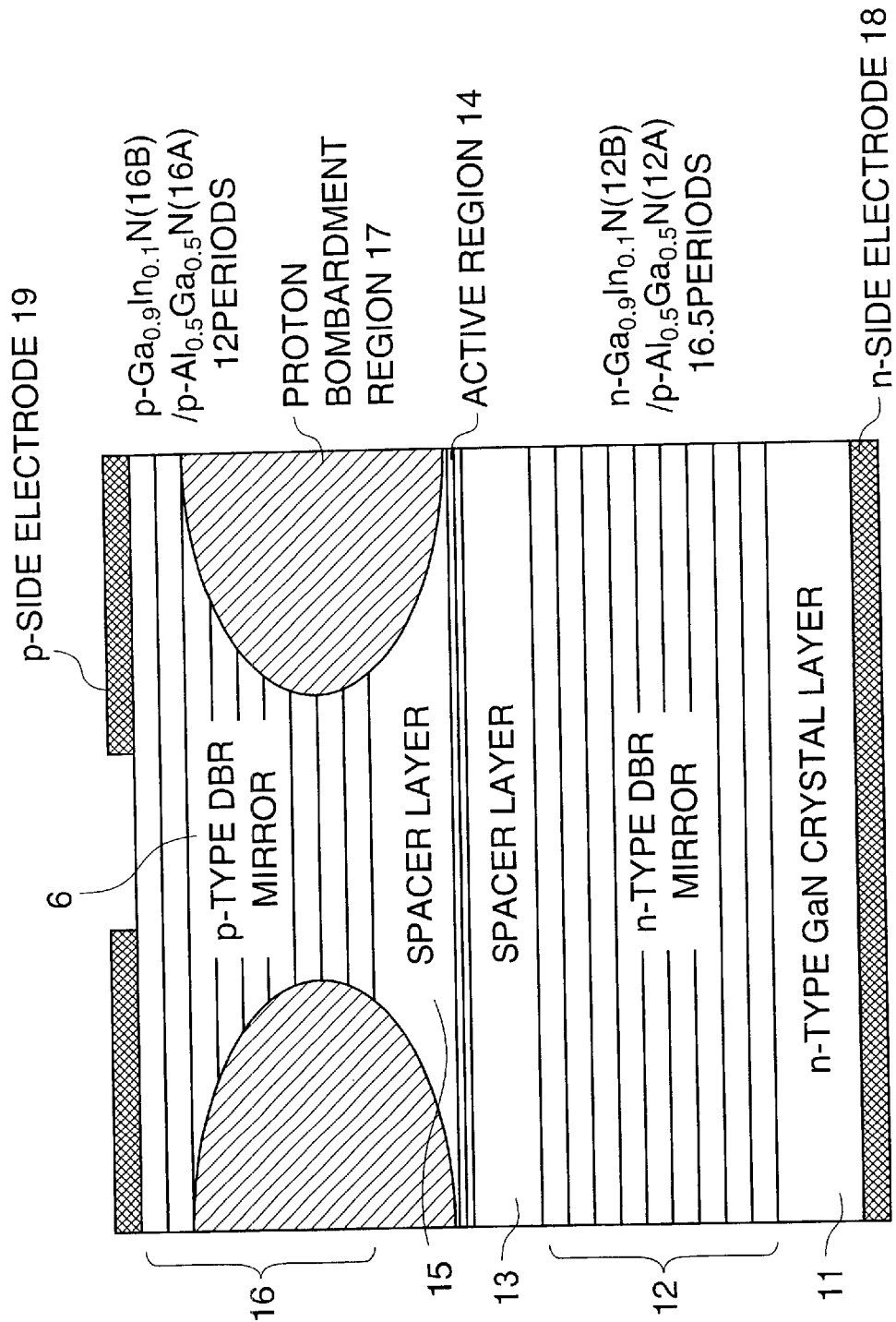
FIG. 4 is a sectional view showing a structure of a surface emitting semiconductor laser of a fifth embodiment.

The fifth embodiment is an example in which the present invention was applied to a surface emitting semiconductor laser. As shown in FIG. 4, the following layers are stacked on an n-type GaN crystal substrate 11 of the surface emitting semiconductor laser to respective thicknesses or in period sequentially in the order thereof: an n-type DBR mirror 12 obtained by alternately growing n-type $Al_{0.5}Ga_{0.5}N$ layers 12A (lower side) and n-type $Ga_{0.9}In_{0.1}N$ layers 12B (upper side) each with a thickness corresponding to an optical path length $\lambda/4$ in 16.5 periods; an undoped GaN spacer layer 13; an active region 14 including a three period stack of a $Ga_{0.8}In_{0.2}N$ quantum well layer of 3 nm thick/a $Ga_{0.95}In_{0.05}N$ barrier layer of 7 nm thick combined as one period; and an undoped GaN spacer 15. A resonator whose optical path length corresponds to $1\lambda$ is constructed of the active region 14, and the spacer layers 13 and 15 between which the active region 14 is sandwiched. A p-type DBR mirror 16 is stacked on the spacer layer 15 by alternately growing p-type $Al_{0.5}Ga_{0.5}N$ layers 16A (lower side) and p-type $Ga_{0.9}In_{0.1}N$ layers 16B (upper side) in 12 periods. An insulating region 17 is formed in the spacer layer 15 and the p-type DBR mirror 16 by proton bombardment in order to restrict a light emitting region. An n-side electrode 18 is formed on the rear surface of the n-type GaN crystal substrate 11 and a p-side electrode 19 is formed on a p-type $Ga_{0.9}In_{0.1}N$ layer, which is the uppermost surface of the p-type DBR mirror 16.

The surface emitting semiconductor laser was fabricated as described below: First of all, An n-type GaN crystal layer 11 was grown on a sapphire substrate (not shown) by means of an ELOG (epitaxially lateral over-growth) method and after the lateral over-growth, the sapphire substrate was etched off to obtain the n-type GaN crystal substrate 11. The n-type $Al_{0.5}Ga_{0.5}N$ layers 12A (lower side) and the n-type $Ga_{0.9}In_{0.1}N$ layers 12B (upper side) each with a thickness corresponding to an optical path length $\lambda/4$ were alternately grown in 16.5 periods on the GaN crystal substrate 11, thereby forming the n-type DBR mirror 12. In the fifth embodiment as well, similarly to the first embodiment, the DBR mirror with good crystallinity could be obtained.

Then, the undoped GaN spacer layer 13 and the active region 14 including the three period stack of a $Ga_{0.8}In_{0.2}N$ quantum well layer of 3 nm thick/a $Ga_{0.95}In_{0.05}N$ barrier layer of 7 nm thick were grown on the n-type DBR mirror 12 and further, the undoped GaN spacer layer 15 was grown on the active region 14. Since crystallinity of the DBR mirror was high, the spacer layer and active region each with high crystallinity could be grown thereon. The p-type $Al_{0.5}Ga_{0.5}N$ layers 16A (lower side) and the p-type $Ga_{0.9}In_{0.1}N$ layers 16B (upper side) were alternately grown on the spacer layer 15 in 12 periods, thereby forming the p-type DBR mirror 16.

Following growth of the p-type DBR mirror 16, the p-type DBR mirror 16 was subjected to proton bombardment to form the insulating region 17 except for a current flowing region. Finally, the n-side electrode 18 was formed on the rear surface of the n-type GaN substrate, while the p-type electrode 19 was formed on a p-type $Ga_{0.9}In_{0.1}N$ layer that was the uppermost front surface layer of the p-type DBR mirror, thus obtaining the surface emitting semiconductor laser shown in FIG. 4.

The surface emitting semiconductor laser could be fabricated when a voltage in 10 μs cycle, 100 ns wide pulses was applied between the n-side electrode 18 and the p-side electrode 19, laser beam of a wavelength 430 nm was emitted. In Table 5, there are shown lattice constants, strains, refractive indices and thicknesses of semiconductor crystals constituting layers of a DBR mirror. In Table 5, there are additionally shown the lattice constants and strains of mixed crystals.

TABLE 5

|  | Fifth embodiment | |
| --- | --- | --- |
|  | $Ga_{0.9}In_{0.1}N$ | $Al_{0.5}Ga_{0.5}N$ |
| Lattice constants (Å) | 3.225 | 3.151 |
| Strains (strain ratios) | 1.011(1.1%) | 0.998(−1.2%) |
| Refractive indices | 2.85 | 2.23 |
| $\lambda/4$ thicknesses (nm) | 37.7 | 48.2 |
| Lattice constant of mixed crystal (Å) | 3.192 | |
| Strain (strain ratio) of mixed crystal | 1.001(0.1%) | |

As described above, according to the surface emitting semiconductor laser of the fifth embodiment, crystallinity of a DBR mirror is improved and thereby, crystallinities of a spacer layer and an active layer are both improved. This not only improves laser characteristics, but extends a lifetime and increases reliability of the laser.

Further, according to the surface emitting semiconductor laser of the fifth embodiment, since a reflection characteristic of a DBR mirror is improved, a wavelength range of light that can be reflected is broader and robustness to light wavelength fluctuations increases, thereby improving reliability of laser performance over temperature fluctuations.

Still further, since a high reflectance DBR mirror can be attained with a small number of stacked layers, an electric resistance of a DBR mirror of the surface emitting semiconductor laser can be reduced, thereby reducing a fabrication time for the DBR mirror.

In addition, in a fabrication process of the surface emitting semiconductor laser, no lateral over-growth on a dielectric DBR mirror is required, bringing a low cost and high reliability of the mirror.

It should be appreciated that while in the fifth embodiment, the n-type DBR mirror 12 and the p-type DBR mirror 16 were both DBR mirrors each of a pseudo lattice matching type achieved by alternately stacking the $Al_{0.05}Ga_{0.05}N$ layers and $Ga_{0.9}In_{0.1}N$ layers, which are made of lattice mismatched materials, the p-type DBR mirror 16 can also be fabricated with dielectric materials such as $SiO_2$ and $TiO_2$.

Sixth embodiment

Figure 8:
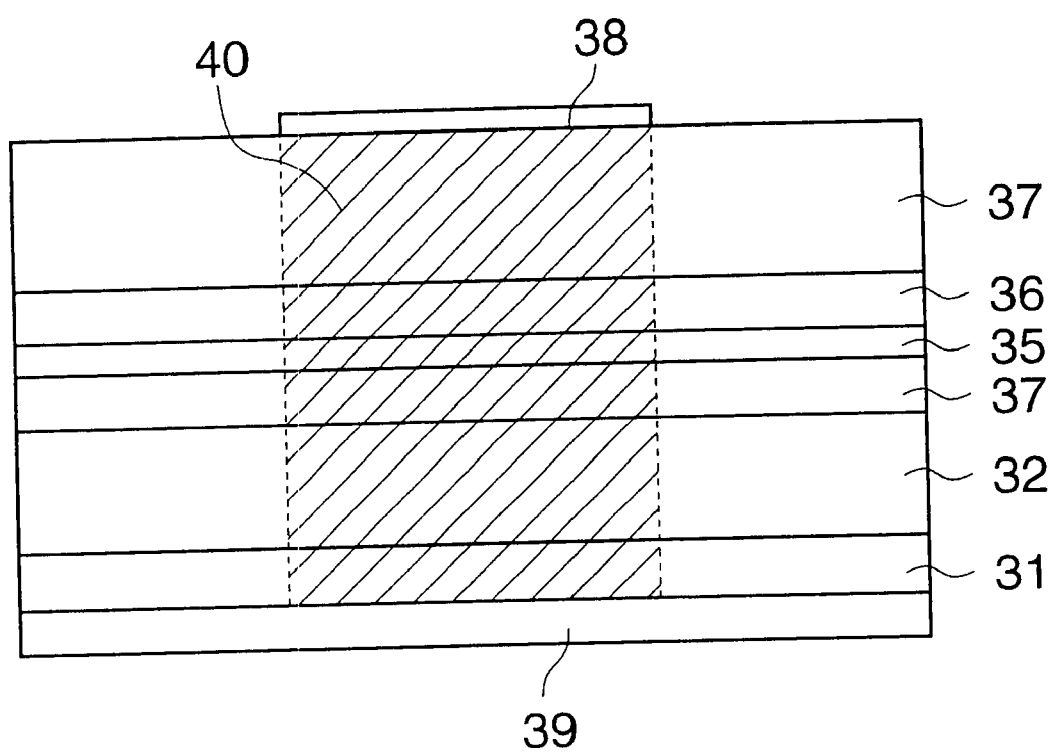
FIG. 8 is a sectional view showing a structure of an edge emitting semiconductor laser of a sixth embodiment.

While in the fifth embodiment, a description was made of the case where the present invention was applied to a surface emitting semiconductor laser, in the sixth embodiment a description will be made of an example in which the present invention was applied to an edge emitting semiconductor laser. As shown in FIG. 8, an n-type cladding layer 32 was formed on an n-type GaN crystal substrate 31 of the edge emitting semiconductor laser by repeatedly forming a 12 period stack of the following layers of respective thicknesses sequentially in the order thereof, similarly to the DBR mirror of the second embodiment: a compressive-strained n-type $Ga_{0.9}In_{0.1}N$ layer 32A of about 19 nm in thickness; a non-strained n-type GaN layer 32B of about 20 nm in thickness; a tensile-strained n-type $Al_{0.5}Ga_{0.5}N$ layer 32c of about 24 nm in thickness; and a non-strained n-type GaN layer 32D of about 20 nm in thickness.

An undoped GaN confinement layer 34 of a thickness about 100 nm; a multi-quantum well structure 35 obtained by growing pairs of a $Ga_{0.15}In_{0.85}N$ quantum well layer/a $Ga_{0.02}In_{0.98}N$ barrier layer in 4 periods; and an undoped GaN confinement layer of about 100 nm in thickness were formed on the n-cladding layer 32, wherein a combination of the confinement layer 34, the multi-quantum well structure 34 and the confinement layer 36 constitute a resonator.

A p-type cladding layer 37 was formed on the confinement layer 36 by repeatedly forming a 12 period stack of the following layers of respective thicknesses sequentially in the order thereof: a compressive-strained p-type $Ga_{0.9}In_{0.1}N$ layer 37A of about 19 nm in thickness; a non-strained p-type GaN layer 37B of about 20 nm in thickness; a tensile-strained p-type $Al_{0.5}Ga_{0.5}N$ layer 37c of about 24 nm in thickness; and a non-strained p-type GaN layer 37D of about 20 nm in thickness.

A p-side electrode 38 of a width 50 μm was formed on the p-type cladding layer 37, an n-side electrode 39 was formed all over the rear surface of the n-type GaN crystal substrate 31. Further, an edge reflector mirror 40 was formed on an incident/emitting edge of the resonator by dry etching, perpendicular to the p-side electrode 38 of a width 50 μm. In Table 6, there are shown lattice constants, strains, refractive indices and thicknesses of semiconductor crystals constituting layers of a cladding layer. In Table 6, there are additionally shown the lattice constants and strains of mixed crystals.

TABLE 6

| | Sixth embodiment | | | |
| --- | --- | --- | --- | --- |
| | $Ga_{0.9}In_{0.1}N$/GaN compressive-strained layers | | $Al_{0.5}Ga_{0.5}N$/GaN tensile-strained layers | |
| | $Ga_{0.9}In_{0.1}N$ | GaN | $Al_{0.5}Ga_{0.5}N$ | GaN |
| Lattice constants (Å) | 3.225 | 3.189 | 3.151 | 3.189 |
| Strains (strain ratios) | 1.011(1.1%) | 1.000 | 0.988(−1.2%) | 1.000 |
| Refractive indices | 2.85 | 2.52 | 2.23 | 2.52 |
| Thicknesses of single layers (nm) | 19 | 20 | 24 | 20 |
| λ/4 thicknesses (nm) of layers | 39 | | 44 | |
| Lattice constant of mixed crystal (Å) | 3.186 | | | |
| Strains (strain ratios) of mixed crystals | 0.999(−0.1%) | | | |

According to the sixth embodiment, since a compressive stress generated in the n-type $Ga_{0.9}In_{0.1}N$ layer 32A is alleviated by a tensile stress generated in the n-type $Al_{0.5}Ga_{0.5}N$ layer when the n-type cladding layer 32 of a pseudo lattice matching type is epitaxially grown on the n-type GaN crystal substrate 31, no lattice defects such as cracks and misfit dislocations arise, thereby enabling the n-type cladding layer 32 with good crystallinity to be formed. Because of a high crystallinity of the n-type cladding layer 32, crystallinities of layers grown on the cladding layer can also be higher, which in turn enables not only reliability of a laser to be improved but a lifetime of a device to be extended.

Further, since the n-type cladding layer 32 and the p-type cladding layer 37 of the sixth embodiment are respective DBR mirrors each obtained by alternately stacking a high refractive index region constructed of the compressive-strained $Ga_{0.9}In_{0.1}N$ layer and the non-strained GaN layer and a low refractive index region constructed of the tensile-strained $Al_{0.5}Ga_{0.5}N$ layer and the non-strained GaN layer with each region of λ/4 in thickness, light can strongly be confined in a confinement layer.

When a current in short pulses was passed between the n-side electrode 39 and the p-side electrode 38, laser oscillation was observed. Thus obtained edge emitting semiconductor laser had a far field pattern perpendicular to the junction surface with a single peak. This is because the edge emitting semiconductor laser strongly confines light between the confinement layers.

Seventh Embodiment

The seventh embodiment is a modification of the sixth embodiment in which a layered structure of a cladding layer of the edge emitting semiconductor laser was modified. While in the sixth embodiment, there is shown the case where a cladding layer was formed by alternately stacking the high refractive index region constructed of a compressive-strained $Ga_{0.9}In_{0.1}N$ layer and a non-strained GaN layer and the low refractive index region constructed of a tensile-strained $Al_{0.5}Ga_{0.5}N$ layer and a non-strained GaN layer with each region of λ/4 in thickness, in the seventh embodiment, an n-type cladding layer of 900 nm in thickness was formed by alternately stacking compressive-strained n-type $Ga_{0.9}In_{0.1}N$ layers 32E each of 1.5 nm in thickness and tensile-strained n-type $Al_{0.5}Ga_{0.5}N$ layers 32F each of 1.5 nm in thickness in 300 periods while a p-type cladding layer 37 of 900 nm in thickness was formed by alternately stacking compressive-strained p-type $Ga_{0.9}In_{0.1}N$ layers 37E each of 1.5 nm in thickness and tensile-strained p-type $Al_{0.5}Ga_{0.5}N$ layers 32F each of 1.5 nm in thickness in 300 periods. In Table 7, there are shown lattice constants, strains, refractive indices and thicknesses of semiconductor crystals constituting layers of a cladding layer. In Table 7, there are additionally shown the lattice constants and strains of mixed crystals.

TABLE 7

| | Seventh embodiment $Ga_{0.9}In_{0.1}N$/$Al_{0.5}Ga_{0.5}N$ superlattice layer | |
| --- | --- | --- |
| | $Ga_{0.9}In_{0.1}N$ | $Al_{0.5}Ga_{0.5}N$ |
| Lattice constants (Å) | 3.225 | 3.151 |
| Strains (strain ratios) | 1.011(1.1%) | 0.988(−1.2%) |
| Refractive indices | 2.85 | 2.23 |
| Thicknesses (nm) of single layers | 1.5 nm | 1.5 nm |
| Lattice constant of mixed crystal (Å) | 3.188 | |
| Strain (strain ratio) of mixed crystal | 1.000(0%) | |
| Bandgap difference between mixed crystal and GaN (meV) | About 290 meV | |

According to the seventh embodiment, since the cladding layer does not constitute a DBR mirror but it constitutes a short period superlattice cladding layer of a pseudo lattice matching type formed by alternately stacking the compressive-strained $Ga_{0.9}In_{0.1}N$ layers and the tensile-strained $Al_{0.5}Ga_{0.5}N$ layers with each layer of several nm or less in thickness, which is thinner than λ/4, in periods corresponding to a layer thickness, a bandgap of the cladding layer can be larger than that of GaN. That is, since a short-period superlattice cladding layer of a pseudo lattice matching type is employed as a cladding layer of an edge emitting semiconductor laser, a cladding layer that has a bandgap to ensure current confinement can be realized without any occurrence of cracks.

While in the first to seventh embodiments, descriptions are made of the semiconductor devices using the nitride semiconductor crystals of the predetermined compositions, a structure including the following constituents can also be applied to a semiconductor device using any semiconductor crystals: a semiconductor base layer made of a semiconductor crystal whose in-plane lattice constant is $a_0$; and a pseudo lattice matching layer including a first layer made of a semiconductor crystal whose in-plane lattice constant is larger than $a_0$, and a second layer made of a semiconductor crystal whose in-plane lattice constant is smaller than $a_0$, the pseudo lattice matched layer being formed while being subjected to pseudo lattice matching by epitaxially growing the first and second layers on the semiconductor base layer such that stresses produced in the first and second layers are canceled by each other.

For example, nitride semiconductor crystals that are used in a semiconductor base layer and a pseudo lattice matched layer are not limited to combinations employed in the first to seventh embodiments, but the following structure is preferred in which a pseudo lattice matched layer including a first layer made of $Ga_{1-x}In_xN$ ($0<x\leq 1$) having an in-plane lattice constant larger than GaN and a second layer made of $Al_yGa_{1-y}N$ ($0<y\leq 1$) having an in-plane lattice constant smaller than GaN is formed on a semiconductor base layer made of GaN or AlGaInN lattice matched to GaN.

Further, the present invention can also be applied to an InP based semiconductor device including an AlGaInAsP based semiconductor laser of a long wavelength range from 1.3 to 1.55 μm. When such a material is employed, the following structure is preferred in which a pseudo lattice matched layer including a first layer made of $Al_xIn_{1-x}As_yP_{1-y}$ ($0<x\leq 1$, $0\leq y<1$) having an in-plane lattice constant larger than InP and a second layer made of $Ga_xIn_{1-x}As_yP_{1-y}$ ($0\leq x<1$, $0<y\leq 1$) having an in-plane lattice constant smaller than InP is formed on a semiconductor base layer made of InP or AlGaInAsP lattice matched to InP.

Further, the present invention can also be applied to GaAs semiconductor devices. When such a material is employed, the following structure is preferred in which a pseudo lattice matched layer including a first layer made of $Ga_yIn_{1-x}P$ ($y<0.51$) having an in-plane lattice constant larger than GaAs and a second layer made of $Al_zIn_{1-z}P$ ($z>0.51$) having an in-plane lattice constant smaller than GaAs is formed on a semiconductor base layer made of GaAs or AlGaInP lattice matched to GaAs.

However, the present invention is especially useful when a semiconductor device of a good characteristic cannot be obtained with a material lattice matched to a semiconductor crystal constituting a semiconductor base layer.

While in the first to seventh embodiments, descriptions are made of the cases in which the present invention was applied to light emitting devices including the surface emitting semiconductor laser and the edge emitting semiconductor laser, it is needless to say that the present invention can also be applied to light receiving devices such as photodetector and a solar cell and electronic devices such as a transistor.

A photodetector can be fabricated in such a manner that a DBR mirror made of AlGaN/GaInN of a pseudo lattice matching type is formed on a GaN semiconductor base layer, then a PIN type light receiving element made of p-type GaN/i-type GaInN/n-type GaN is formed on the DBR mirror and thereafter a p-side electrode and an n-side electrode are respectively formed on the p-type GaN and the n-type GaN. A backward biased voltage is applied between the electrodes and thereby the structure functions as a light receiving device with high speed responsibility. The light transmitted through the light receiving device is reflected by the DBR mirror and the reflected light is again transmitted through the light receiving device, thereby enabling light receiving efficiency to be improved.

Further, a solar cell can be fabricated in such a manner that a DBR mirror of a pseudo lattice matching type is formed on a semiconductor base layer, p-type GaInN/n-type GaInN layers are further formed on the DBR mirror and then, electrodes to take out current converted from the sunlight are respectively formed on the p-type GaInN and n-type GaInN layers. The sunlight transmitted through constituent layers of the solar cell is reflected by the DBR mirror and the reflected light is again transmitted through the constituent layers, thereby enabling electro-optic conversion ratio to be improved.

Still further, a transistor can be fabricated in such a manner that a short period superlattice collector of p-type GaInN/p-type AlGaN, which are constructed with pseudo lattice matched layers, is formed on a semiconductor base layer, a n-type GaInN base is formed further on the short period superlattice collector, a p-type GaInN/p-type AlGaN is formed further on then-type GaInN base, and then electrodes are formed on the respective layers. Since GaN based materials are of a wide bandgap, transistor thus fabricated can operate at a temperature as high as in the range of about 300 to about 400° C.

According to the present invention, there can be provided a semiconductor device having a pseudo lattice matched layer of good crystallinity, formed with lattice mismatched materials. Further, there can be provided a semiconductor device having a pseudo lattice matched layer of a good reflection characteristic, formed with lattice mismatched materials. Still further, there can be provided a surface emitting semiconductor laser and an edge emitting semiconductor laser, both of good light emitting characteristic.

What is claimed is:

1. A surface emitting semiconductor laser comprising:
a semiconductor base layer made of a semiconductor crystal whose in-plane lattice constant is $a_0$;
a cladding layer or DBR mirror including a first layer made of a semiconductor crystal having an in-plane lattice constant $a_1$, and a second layer made of a semiconductor crystal having an in-plane lattice constant $a_2$, wherein $a_1 \geq a_0 \times 1.003$ $a_2 \leq a_0 \times 0.997$, and the cladding layer or DBR mirror is formed while being subjected to pseudo lattice matching by epitaxially growing the first and second layers on the semiconductor base layer such that lattice strains produced in the first and second layers assume opposite directions;

an active region having at least one function of recombination, generation and migration of carriers; and the active region and the cladding layer or DBR mirror arranged at different vertical levels vertically above the semiconductor base layer, wherein the semiconductor base layer comprises GaN or AlGaInN lattice matched to GaN, the first layer comprises $Ga_{1-x}In_xN$, wherein $0<x\leq1$, and the second layer comprises $Al_yGa_{1-y}N$, wherein $0<y\leq1$.

2. A surface emitting semiconductor laser comprising:

a semiconductor base layer made of a semiconductor crystal whose in-plane lattice constant is $a_0$;

a cladding layer or DBR mirror including a first layer made of a semiconductor crystal having an in-plane lattice constant $a_1$, and a second layer made of a semiconductor crystal having an in-plane lattice constant $a_2$, wherein $$a_1 \geq a_0 \times 1.003$$

$$a_2 \leq a_0 \times 0.997,$$

and the cladding layer or DBR mirror is formed while being subjected to pseudo lattice matching by epitaxially growing the first and second layers on the semiconductor base layer such that lattice strains produced in the first and second layers assume opposite directions;

an active region having at least one function of recombination, generation and migration of carriers; and the active region and the cladding layer or DBR mirror arranged at different vertical levels vertically above the semiconductor base layer, wherein the semiconductor base layer comprises InP or AlGaInAsP lattice matched to InP, the first layer comprises $Al_xIn_{1-x}As_yP_{1-y}$, wherein $0<x\leq1$ and $0\leq y<1$, and the second layer comprises $Ga_xIn_{1-x}As_yP_{1-y}$, wherein $0<x\leq1$ and $0<y\leq1$.

3. A surface emitting semiconductor laser comprising:

a semiconductor base layer made of a semiconductor crystal whose in-plane lattice constant is $a_0$;

a cladding layer or DBR mirror including a first layer made of a semiconductor crystal having an in-plane lattice constant $a_1$, and a second layer made of a semiconductor crystal having an in-plane lattice constant $a_2$, wherein $$a_1 \geq a_0 \times 1.003$$

$$a_2 \leq a_0 \times 0.997,$$

and the cladding layer or DBR mirror is formed while being subjected to pseudo lattice matching by epitaxially growing the first and second layers on the semiconductor base layer such that lattice strains produced in the first and second layers assume opposite directions;

an active region having at least one function of recombination, generation and migration of carriers; and the active region and the cladding layer or DBR mirror arranged at different vertical levels vertically above the semiconductor base layer, wherein the semiconductor base layer comprises GaAs or AlGaInP lattice matched to GaAs, the first layer comprises $Ga_yIn_{1-y}P$, wherein $y<0.51$, and the second layer comprises $Al_zIn_{1-z}P$, wherein $z>0.51$.

4. The surface emitting semiconductor laser according to claim 1, wherein an in-plane lattice constant $a_x$ of the pseudo lattice matched layer satisfies a relation described below in connection with the in-plane lattice constant $a_0$ of the semiconductor crystal of the semiconductor base layer:

$$a_0 \times 0.997 \leq a_x \leq a_0 \times 1.003.$$

5. The surface emitting semiconductor laser according to claim 1, wherein an in-plane lattice constant $a_1$ of the semiconductor crystal of the first layer and an in-plane lattice constant $a_2$ of the semiconductor crystal of the second layer satisfy the relation described below:

$$a_1 \geq a_0 \times 1.006$$

$$a_2 \leq a_0 \times 0.994.$$

6. The surface emitting semiconductor laser according to claim 1, wherein the pseudo lattice matched layer is formed by alternately stacking the first and second layers.

7. The surface emitting semiconductor laser according to claim 1, wherein the pseudo lattice matched layer includes a third layer made of a semiconductor crystal whose in-plane lattice constant is $a_0$ in addition to the first and second layers.

8. The surface emitting semiconductor laser according to claim 1, wherein at least one of the first and second layers is formed by stacking plural semiconductor crystals with different in-plane lattice constants.

9. The surface emitting semiconductor laser according to claim 1, wherein each layer of the pseudo lattice matched layer has a thickness equal to or less than 10 nm.

10. The surface emitting semiconductor laser according to claim 1, wherein a bandgap of the pseudo lattice matched layer is larger than a bandgap of the semiconductor crystal of the semiconductor base layer.

11. The surface emitting semiconductor laser according to claim 1, wherein the pseudo lattice matched layer is formed by alternately stacking high and low refractive index regions.

12. The semiconductor device according to claim 11, wherein the high refractive index region and the low refractive index region are alternatively stacked with each region of $m\lambda/4$ in thickness, where $\lambda$ is an emission wavelength from an active region and $m=1$ or 3, to form a distributed-Bragg reflector mirror.

13. A surface emitting semiconductor laser comprising:

the semiconductor device according to claim 1, wherein the psuedo lattice matching layer is a first distributed-Bragg reflector mirror, and the functioning layer is formed on the first distributed-Bragg reflector mirror, which performs recombination of carriers; and a second distributed-Bragg reflector mirror that sandwiches the functioning layer with the first distributed-Bragg reflector mirror, to form a resonator mirror structure with the first and second distributed-Bragg reflector mirrors.

14. The surface emitting semiconductor laser according to claim 1, wherein the second distributed-Bragg reflector mirror is a distributed-Bragg reflector mirror of a pseudo lattice matching type including a first layer made of a semiconductor crystal whose in-plane lattice constant is larger than $a_0$ and a second layer made of a semiconductor crystal whose in-plane lattice constant is smaller than $a_0$, the second distributed-Bragg reflector mirror of a pseudo lattice matching type being formed while being subjected to pseudo lattice matching by epitaxially growing the first and second layers on the semiconductor base layer such that lattice strains produced in the first and second layers assume opposite directions.

15. An edge emitting semiconductor laser comprising:

the semiconductor device according to claim 1, wherein the psuedo lattice matching layer comprises a first cladding layer, the functioning layer is formed on the first cladding layer, which performs recombination of carriers, and the functioning layer and the first cladding layer are arranged at different vertical levels vertically above the semiconductor base layer;

further comprising a second cladding layer that sandwiches the functioning layer with the first cladding layer, to achieve light confinement in the functioning layer; and a pair of edge reflector mirrors disposed in an opposite manner, which resonate light generated in the functioning layer in a predetermined plane direction of the functioning layer.

* * * * *